(12) United States Patent
Enders et al.

(10) Patent No.: US 6,472,767 B1
(45) Date of Patent: Oct. 29, 2002

(54) STATIC RANDOM ACCESS MEMORY (SRAM)

(75) Inventors: Gerhard Enders, Glen Allen, VA (US); Thomas Schulz, Rauxel (DE); Dietrich Widmann, deceased, late of Unterhaching (DE), by Helga Widman, legal representative; Lothar Risch, Neubiberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/302,757

(22) Filed: Apr. 30, 1999

(51) Int. Cl.[7] ............................................. H01L 27/11
(52) U.S. Cl. .................... 257/903; 257/331; 257/369; 257/365
(58) Field of Search ........................ 257/903, 905, 257/331, 334, 369, 393, 365, 401

(56) References Cited

U.S. PATENT DOCUMENTS

| | | | |
|---|---|---|---|
| 4,670,768 A | | 6/1987 | Sunami et al. |
| 5,181,088 A | | 1/1993 | Mikata et al. |
| 5,376,814 A | * | 12/1994 | Lee ............................ 257/903 |
| 5,550,396 A | * | 8/1996 | Tsutsumi ..................... 257/334 |
| 5,656,842 A | * | 8/1997 | Iwamatsu et al. ........... 257/329 |
| 5,670,803 A | * | 9/1997 | Beilstein, Jr, et al. ...... 257/903 |

OTHER PUBLICATIONS

Co–Pending Patent Application No. 09/302,768 filed Apr. 30, 1999.

* cited by examiner

Primary Examiner—Mark V. Prenty
(74) Attorney, Agent, or Firm—Stanton Braden

(57) ABSTRACT

A semiconductor body having a pair of vertical, double-gated CMOS transistors. An insulating layer extending horizontally beneath the surface of the semiconductor body such insulating layer being disposed beneath the pair of transistors. The transistors, together with additional such transistors, are arranged to form a Synchronous Dynamic Random Access Memory (SRAM) array. The array includes a plurality of SRAM cells arranged in rows and columns, each one of the cells having a WORDLINE connected to a WORLDINE CONTACT. The WORDLINE CONTACT is common to four contiguous one of the cells. One of the cells having a plurality of electrically interconnected MOS transistors arranged to provide an SRAM circuit. Each one of the cells has a VDD CONTACT and a VSS CONTACT. One of such CONTACTs is disposed centrally within each one of the cells and the other one of the CONTACTs being common to four contiguous ones of the cells. Each one of the cells has the common one of the CONTACTs and the WORDLINE CONTACT disposed at peripheral, corner regions of the cell.

15 Claims, 32 Drawing Sheets

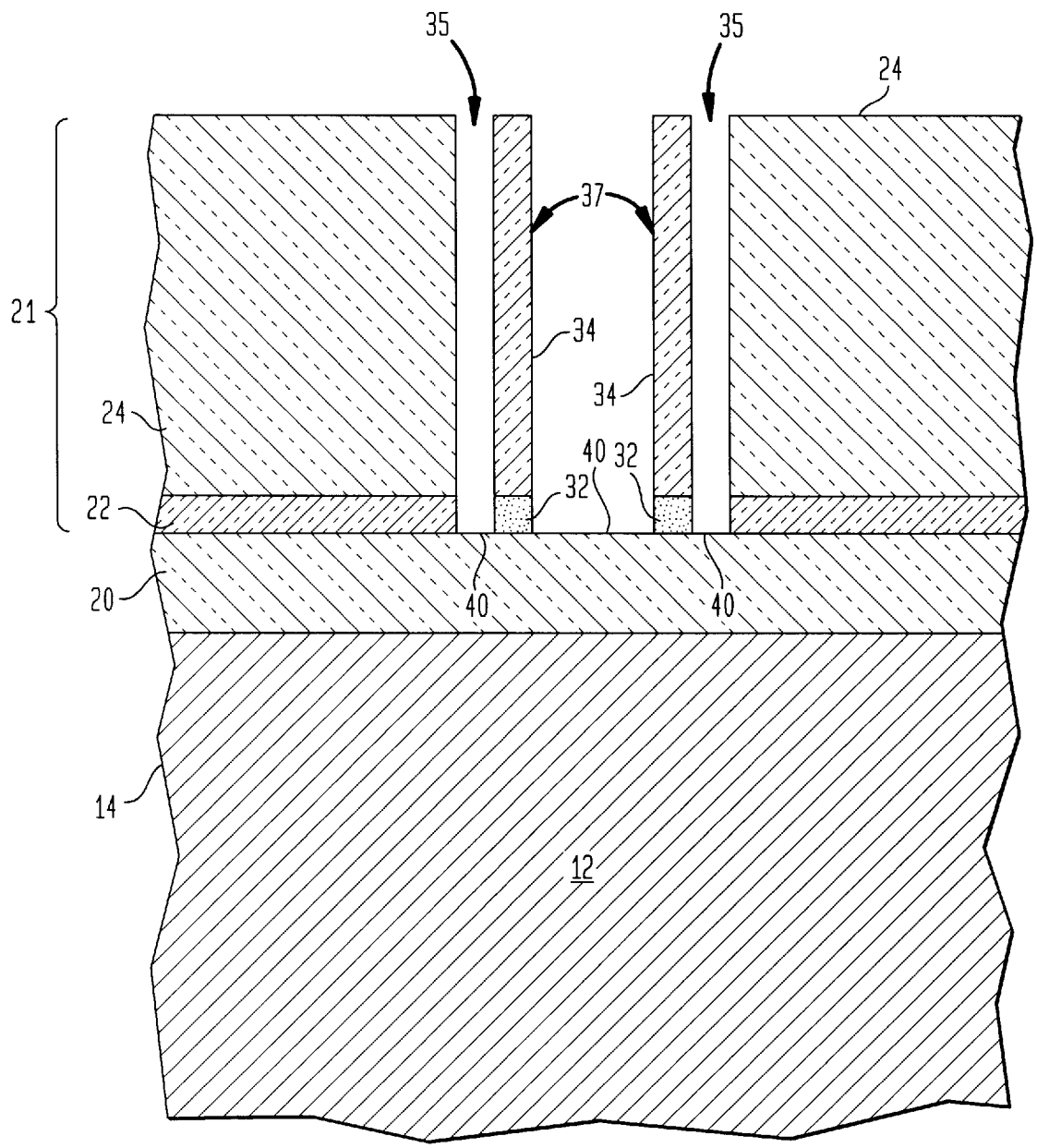

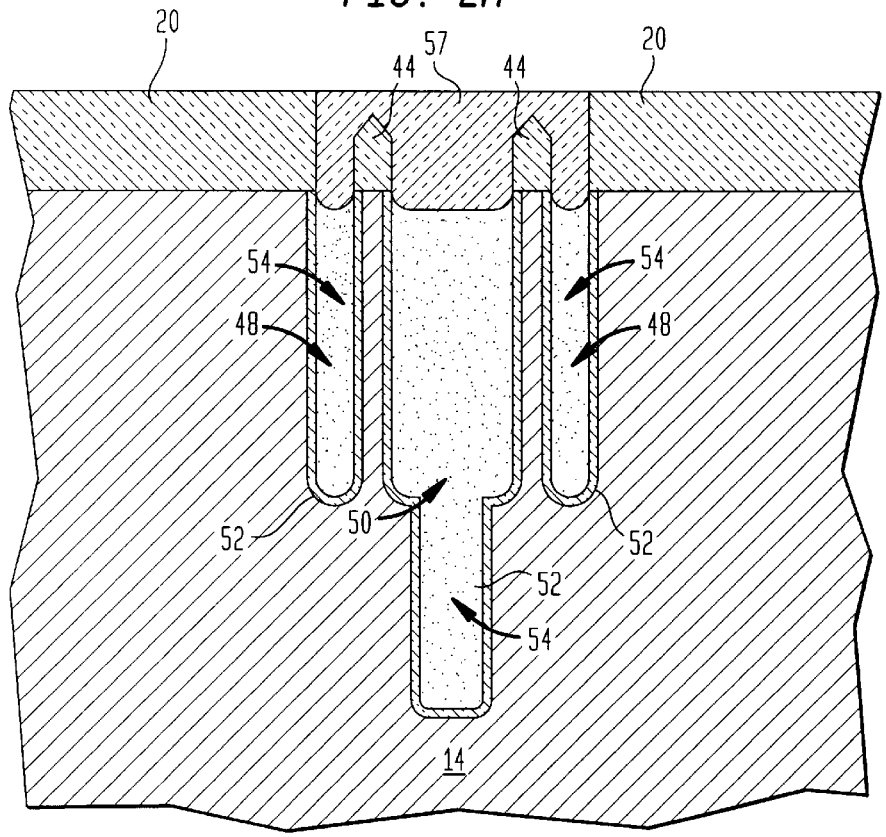
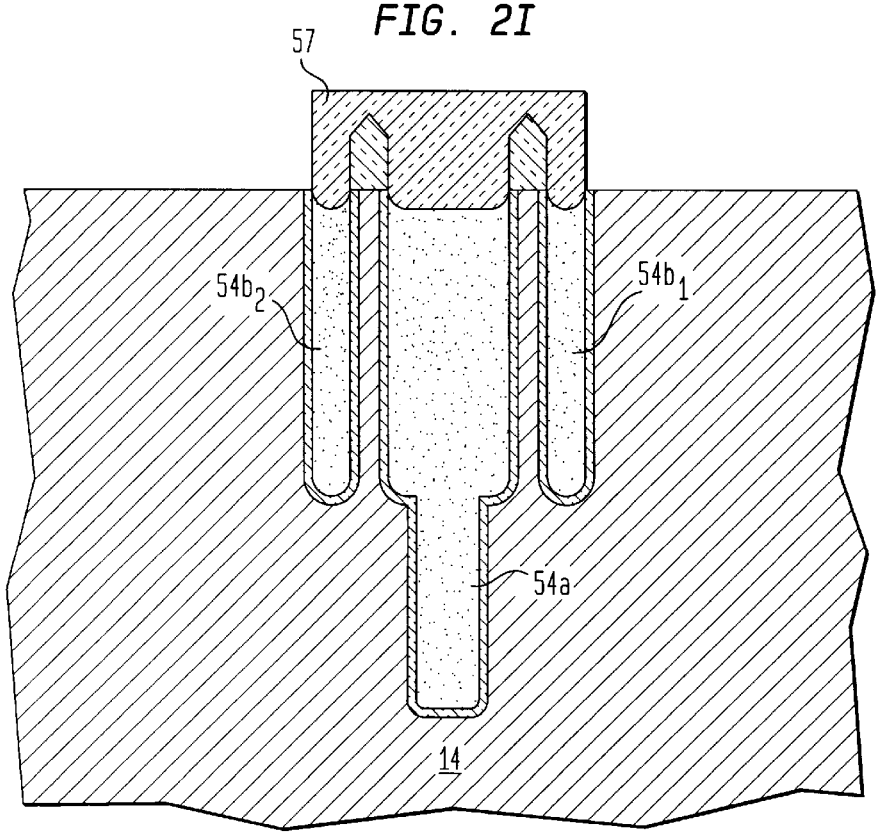

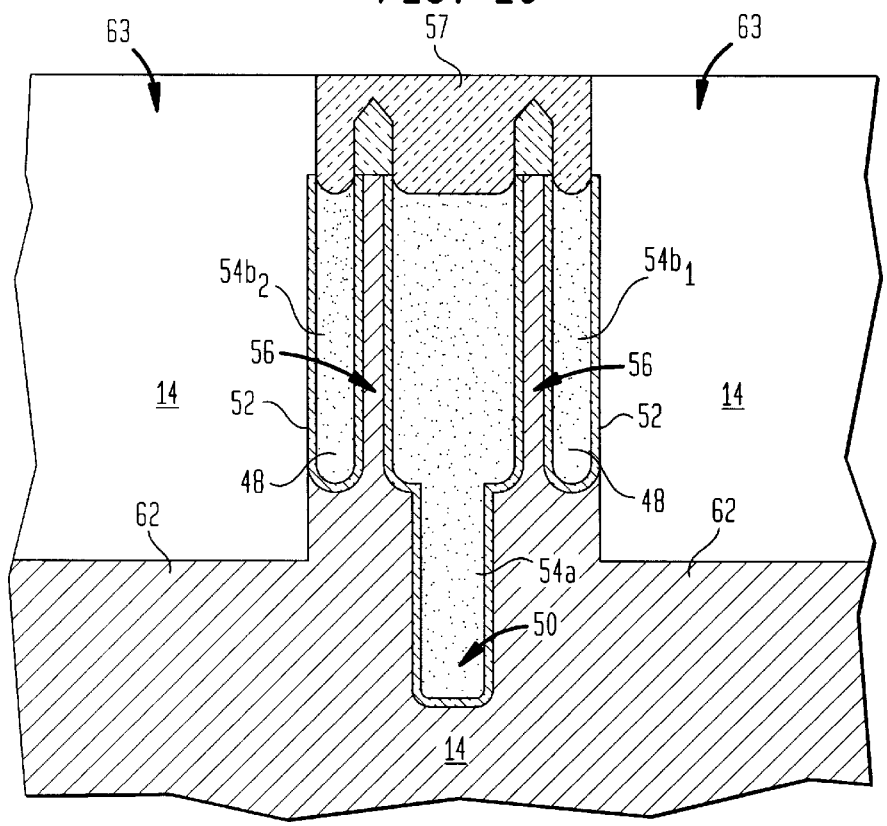
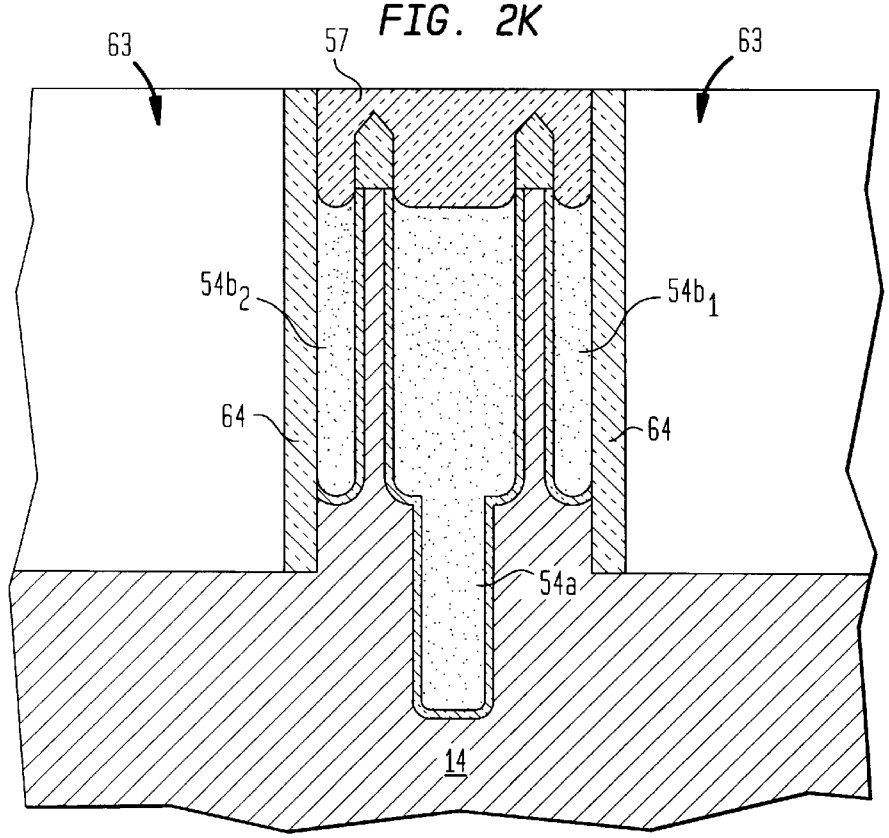

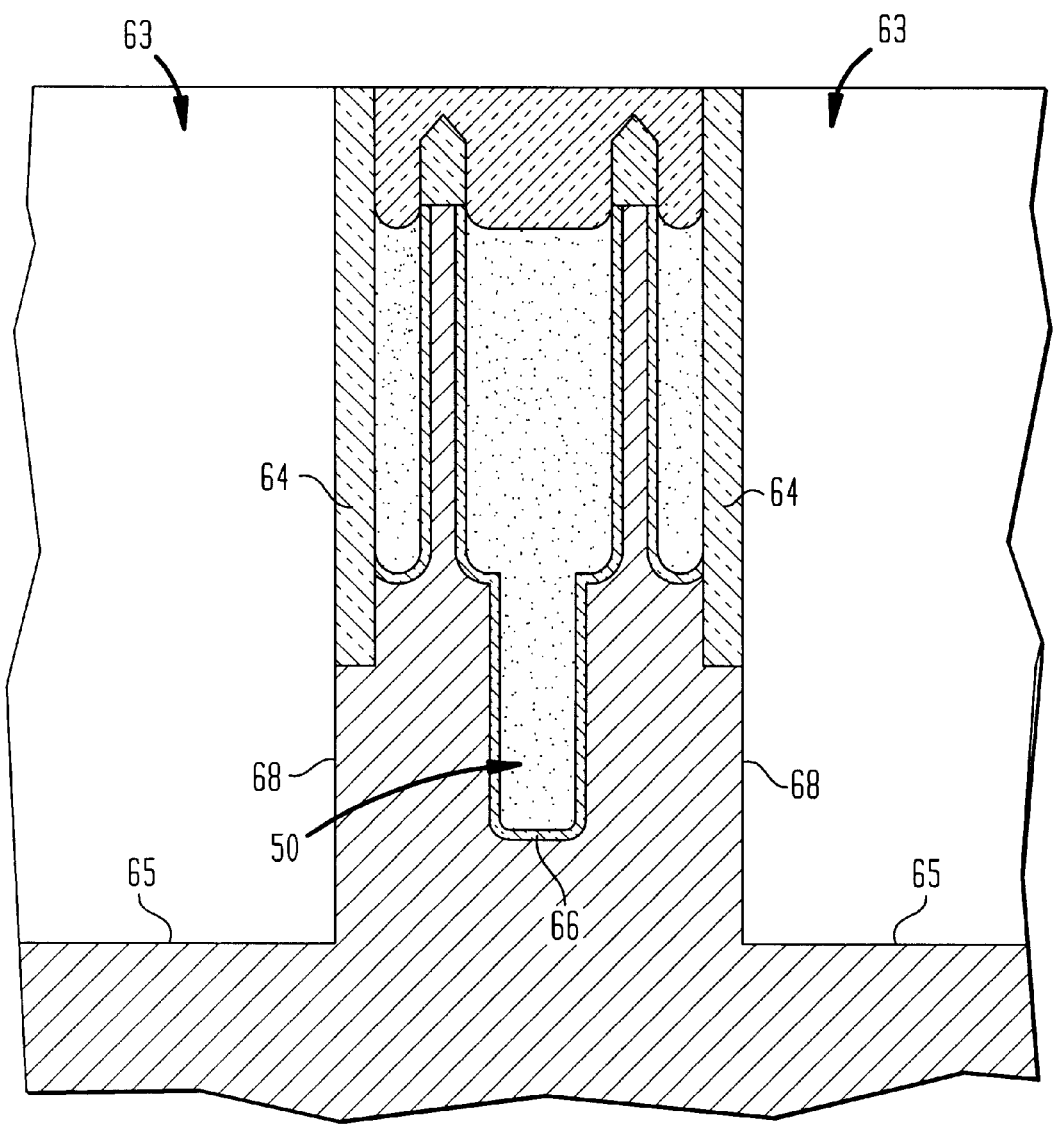

STATIC RANDOM ACCESS MEMORY (SRAM)

BACKGROUND OF THE INVENTION

This invention relates generally to random access memories and more particularly to static random access memories (SRAMs).

As is known in the art, SRAMs have a wide range of applications. It is desirable to minimize the surface area used to form such an SRAM.

SUMMARY OF THE INVENTION

In accordance with one embodiment of the invention, an array of SRAM cells is provided. Each one of the cells has a plurality of electrically interconnected MOS transistors. Each one of the cells has a VDD CONTACT and a VSS CONTACT. One of such CONTACTs is disposed centrally within each one of the cells and the other one of the CONTACTs being common to four contiguous ones of the cells.

In accordance with another embodiment, each one of the cells has the common one of the CONTACTs and the WORDLINE CONTACT disposed at peripheral, corner regions of the cell.

In accordance with another embodiment, a method is provided for forming a transistor in a semiconductor body. The method includes forming a layer of material having a predetermined vertical thickness over a horizontal surface portion of the semiconductor body. Using the layer of material as a mask, a trench is etched into unmasked portions of the semiconductor body. A source, drain, and gate channel region is formed in a portion of the semiconductor body masked by the layer of material.

In accordance with another embodiment, a gate insulator is formed on a sidewall of the trench. Further, a gate conductors is formed in the trench.

In accordance with another embodiment, a method for forming a transistor in a semiconductor body is provided. The method includes forming a layer of material having a predetermined vertical thickness over a horizontal surface portion of the semiconductor body. Using the layer of material as a mask, a trench is into unmasked portions of the semiconductor body. A source, drain, and gate channel region is formed in a vertical relationship in the surface portion of the semiconductor portion of the semiconductor body masked by the layer of material. Gate conductors are formed over opposite sides of the gate channel region.

In accordance with another embodiment, a method is provided for forming a transistor in a semiconductor body. The method includes patterning a covering material along a horizontal surface of the semiconductor body to provide such material with a vertically extending sidewall portion. A layer of material with a predetermined thickness is conformally deposited a over the horizontal surface of the covering material and over the vertically extending sidewall portion of the covering material to provide a vertically extending portion of such layer of material. The layer of material is anisotropically etched to remove the portion of such material deposited over the horizontal surface portion of the covering material while leaving the vertically extending portion of such layer of material. Using the vertically extending portion of the layer of material as a mask, a trench is etched into unmasked portions of the semiconductor body. A source, drain, and gate channel region is formed in a portion of the semiconductor body masked by the vertically extending portion of the layer of material.

In accordance with another embodiment, the transistors, together with additional such transistors, are arranged to form a Synchronous Dynamic Random Access Memory (SRAM) array. The array includes a plurality of SRAM cells arranged in rows and columns, each one of the cells having a WORDLINE connected to a WORDLINE CONTACT. The WORDLINE CONTACT is common to four contiguous one of the cells. One of the cells having a plurality of electrically interconnected MOS transistors arranged to provide an SRAM circuit. Each one of the cells has a VDD CONTACT and a VSS CONTACT. One of such CONTACTs is disposed centrally within each one of the cells and the other one of the CONTACTs being common to four contiguous ones of the cells. Each one of the cells has the common one of the CONTACTs and the WORDLINE CONTACT disposed at peripheral, corner regions of the cell.

BRIEF DESCRIPTION OF THE DRAWING

These and other features of the invention will become more readily apparent from the following detailed description when taken together with the accompanying drawings, in which:

FIGS. 2B–2E, 2E-1, 2E-2, 2E-3, 2E-4, 2F–2P, 2P-1, 2P-2, 2Q–2S are cross-sectional views of the body of FIG. 2A at various stages in the fabrication thereof in accordance with the invention;

FIGS. 3A–3D and 3N are cross-sectional views of the body of FIG. 3A at various stages in the fabrication thereof in accordance with the invention, FIGS. 3A, 3B, 3C, 3D, and 3N being at stages corresponding to FIGS. 2A–2D and 2N;

FIG. 4 is a schematic diagram of an SRAM cell;

DESCRIPTION OF THE PREFERRED EMBODIMENTS

Figure 1:
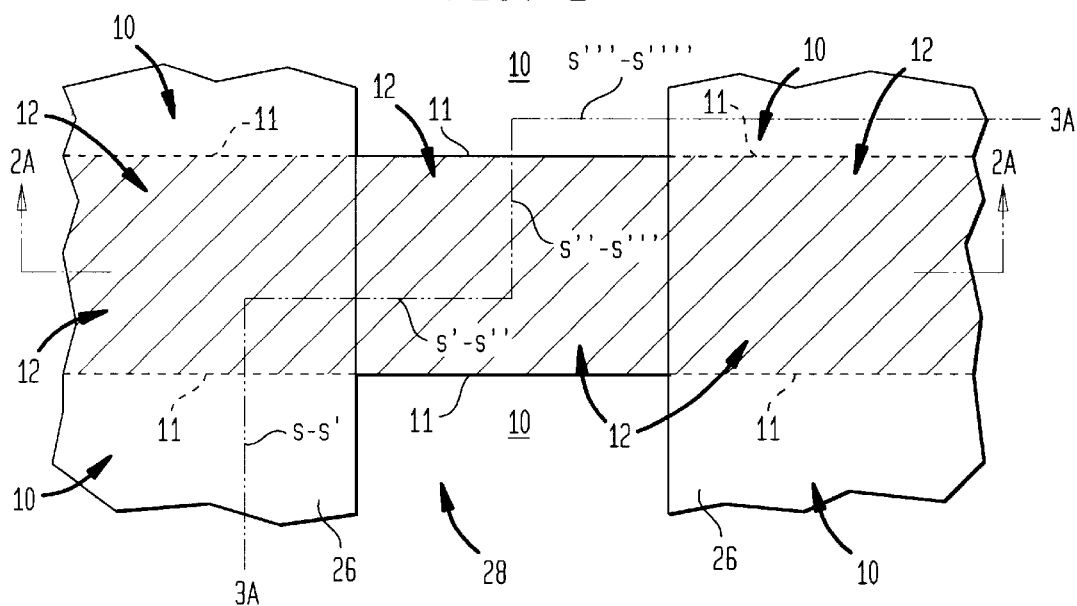
FIG. 1 is a plan view of a semiconductor body at one stage in the fabrication thereof in accordance with the invention.
Figure 2A:
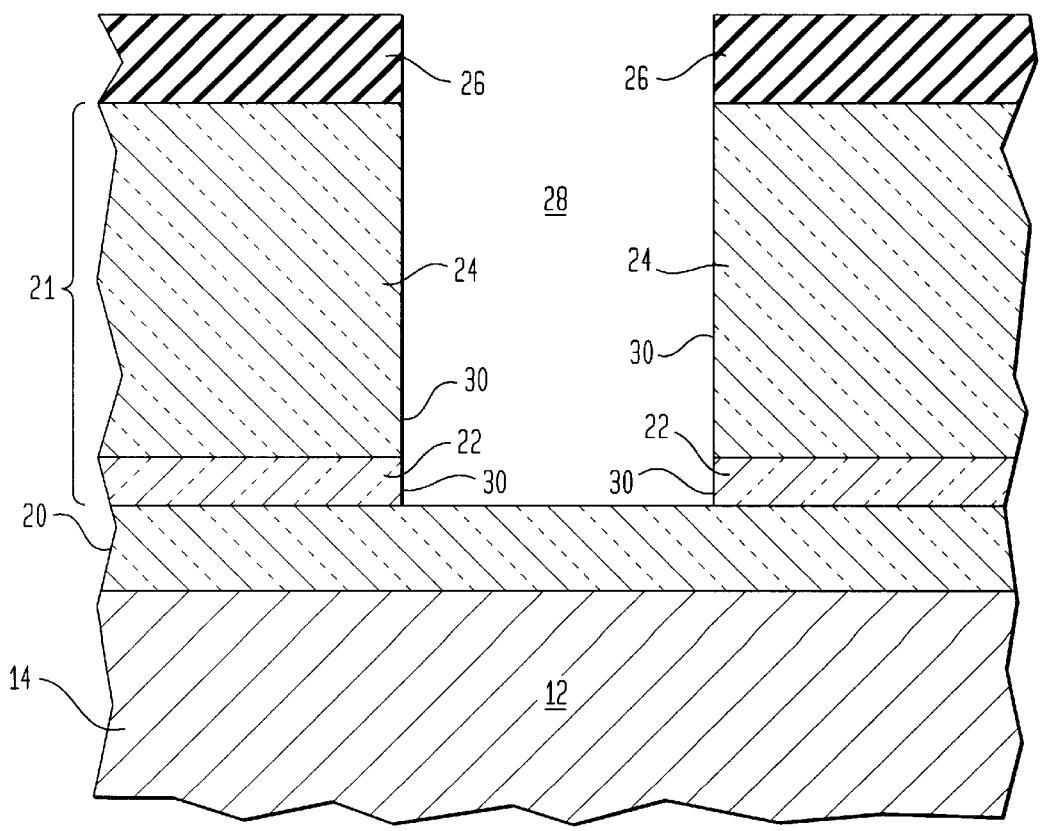
FIG. 2A is a cross-sectional view of the semiconductor body of FIG. 1, such cross section being taken along line 2A—2A in FIG. 1.
Figure 3A:
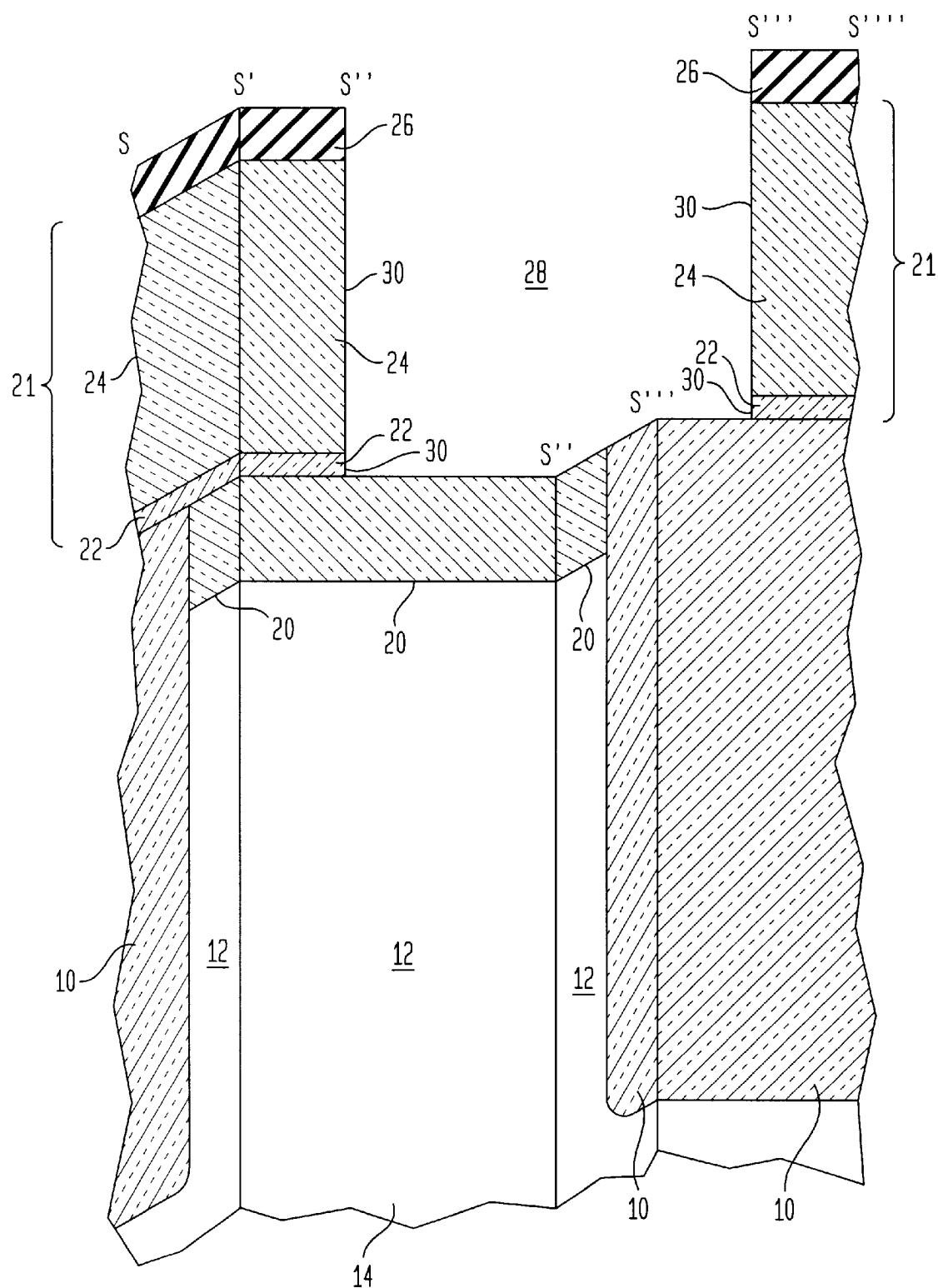
FIG. 3A is cross-section, somewhat perspective view, of the semiconductor body of FIG. 1, such cross section being taken along line 3A—3A in FIG. 1.

Referring now to FIGS. 1, 2A, and 3A, shallow trench isolation (STI) dielectric regions 10 (FIG. 3A) are formed along lines 11 in the horizontal, planar surface, of a single crystal, semiconductor substrate. The substrate is here a p-type conductivity, boron doped, silicon body 14. Here, the shallow trenches of the STI regions 10 are filled with silicon dioxide using any conventional technique. The STI regions 10 thereby delineate an active area 12 in the silicon body 14, here having a width of about 320 nanometers (nm) between lines 11. The active area 12 is then covered with a first silicon nitride layer 20, here having a thickness of about 80 nm. A second silicon nitride layer 22, here having a thickness of 20 nm, and a thicker silicon dioxide layer 24, here 320 nm, are sequentially deposited over the first silicon nitride layer 22. A gate conductor mask 26, here a layer of photoresist patterned using conventional lithography, to have a window 28 with a width, here 320 nm, is formed over the silicon dioxide layer 24. Using the patterned photoresist layer 26 as a mask, the portions of the silicon dioxide layer 24 exposed by the window 28 are anisotropically etched (e.g., using a reactive ion etch, RIE, process) to expose an underlying surface portion of the second silicon nitride layer 22. The exposed portions of the second silicon nitride layer 22 are anisotropically etched (e.g., using the reactive ion etch, RIE, process) to expose an underlying surface portion of the first silicon nitride layer 20, as shown in FIGS. 2A and 3A. The photoresist layer 26 is then removed. It is noted that the RIE process forms a composite mask 21 made up of the patterned silicon dioxide layer 24 and second silicon nitride layer 22. Thus, the composite mask 21 provides a mask having a window 28 with a pair of horizontally spaced, opposing, vertically extending sidewalls 30. Further, the window 28 exposes a portion of the first silicon nitride layer 20 and such mask covers a non-windowed portion of the first silicon nitride layer 20.

Figure 2B:
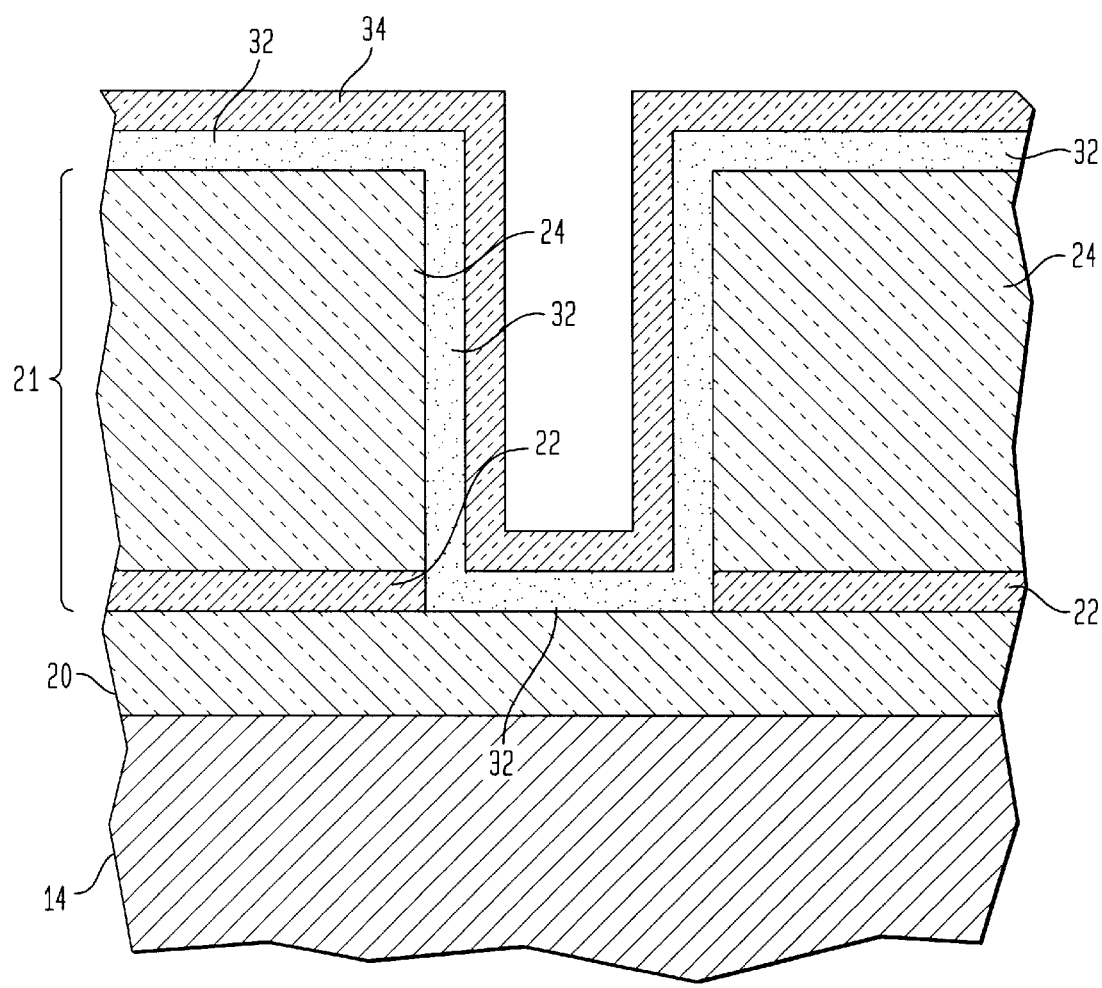
Figure 3B:
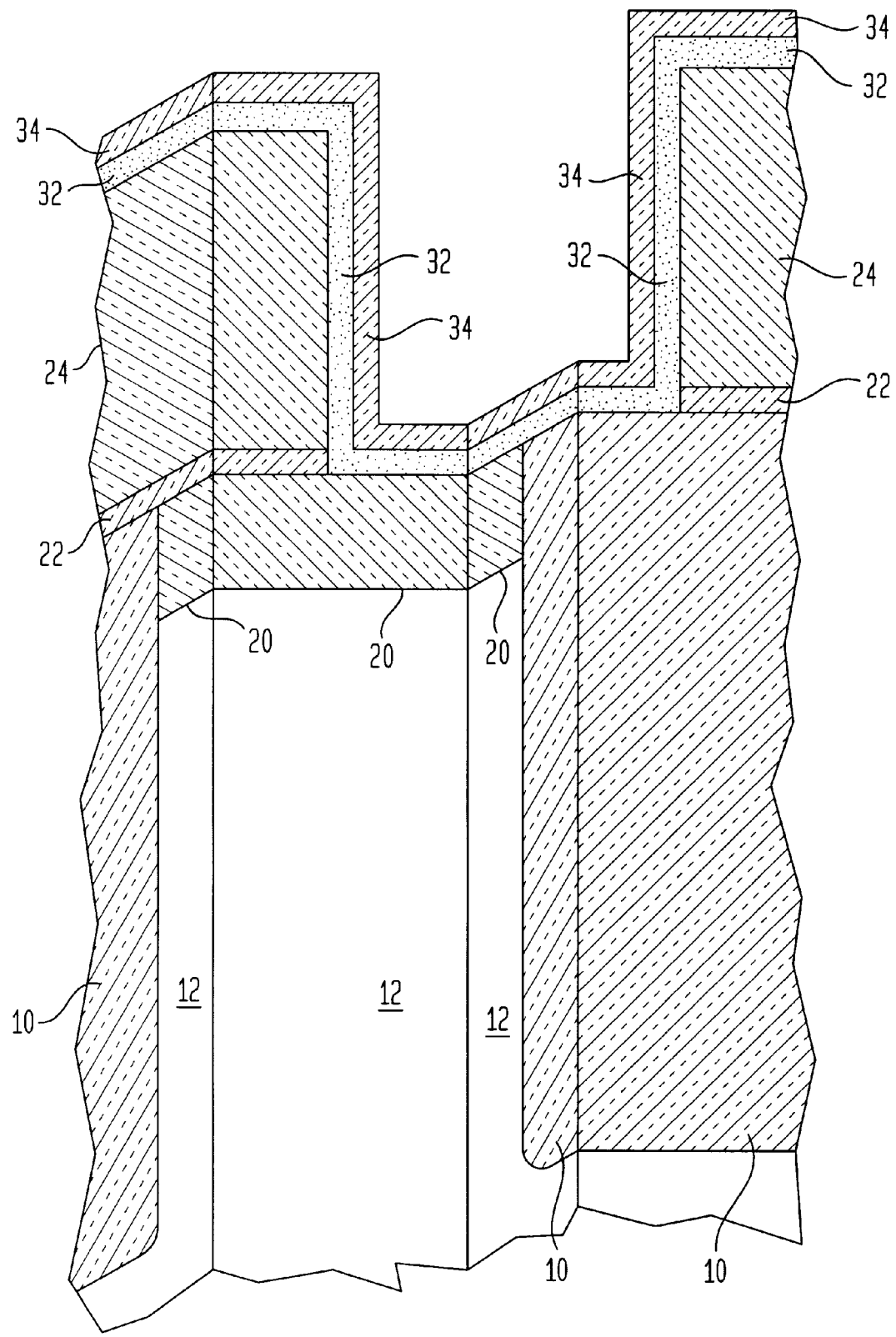

Referring now to FIGS. 2B and 3B, a layer 32 of a sacrificial material, here polycrystalline silicon, is conformally deposited over the composite mask 21. The polycrystalline silicon layer 32 is deposited with a predetermined, uniform thickness, here about 20 nm. A layer 34 of silicon nitride is conformally deposited over the layer 32 of polycrystalline silicon. The layer 34 of silicon nitride is deposited with a predetermined, uniform thickness, here about 20 nm. It is noted from FIG. 3B that these layers 32, 34 of polycrystalline silicon and silicon nitride, respectively, extend over the STI silicon dioxide regions 10. Next, an RIE process is used to remove the horizontally disposed portions of layer 34 of silicon nitride and, subsequently, the horizontally portions of the underlying polycrystalline silicon layer 32 leaving vertically extending portions of the silicon nitride layer 34 and vertically extending portions of the polycrystalline silicon 32. It is noted that the upper surfaces of both the silicon nitride layer 34 and polycrystalline silicon 32 are exposed.

Figure 3C:
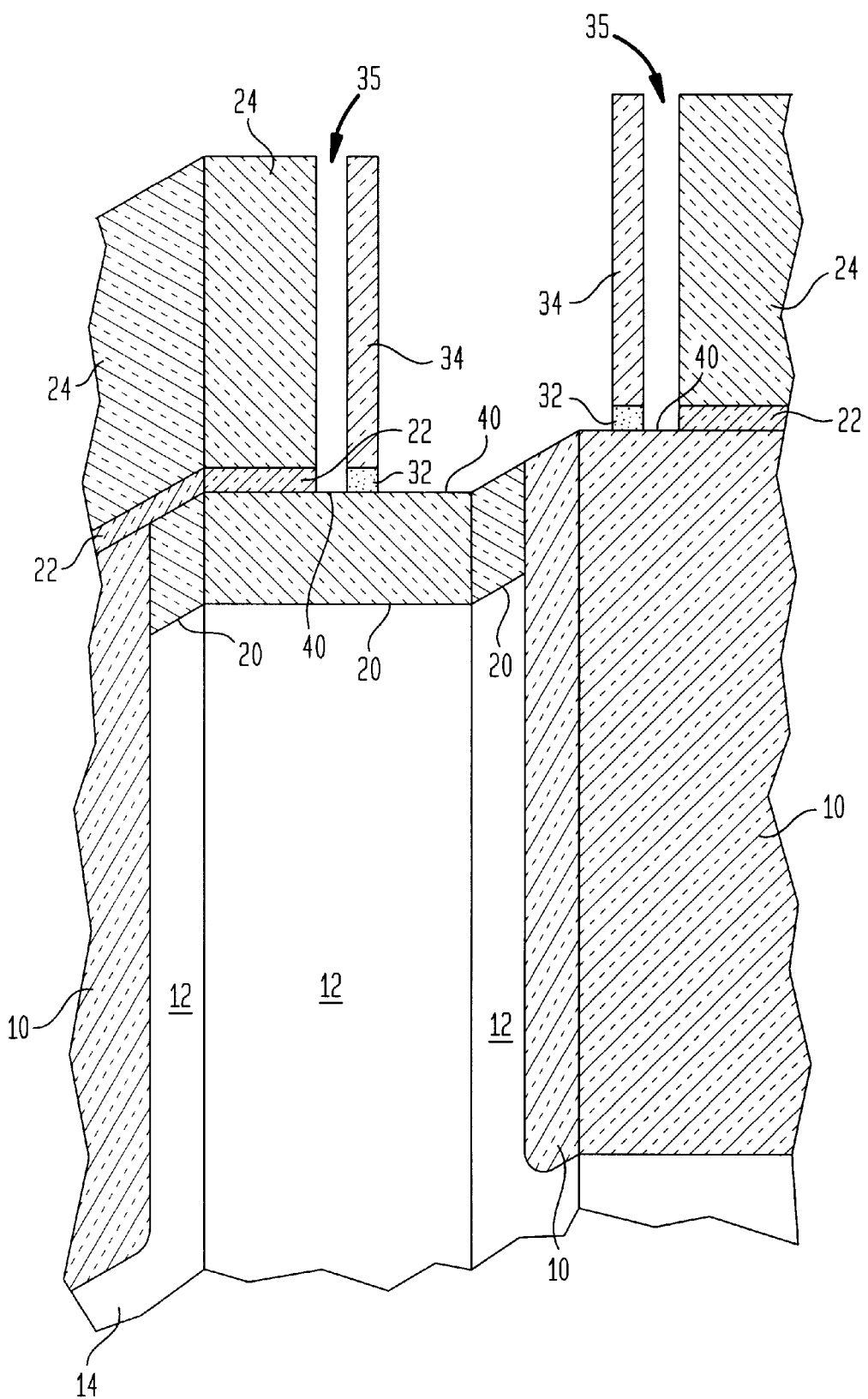

Next, using an anisotropic etch, (e.g. a Reactive Ion Etch (RIE)) process to avoid undercutting of silicon nitride layer 34, the vertically extending portions of polycrystalline silicon layer 32 are selectively removed to produce the structure shown in FIGS. 2C and 3C. It is first noted that portions of the polycrystalline silicon layer 32 remain under the vertical silicon nitride layer, or spacers 34. Thus, slits 35 are formed between sidewalls of the silicon dioxide layer 24/silicon nitride layer 22 and silicon nitride spacers 34. Each one of the slits 35 has a width substantially the same as the thickness of the sacrificial, polycrystalline silicon layer 32 (FIGS. 2B and 3B). It is next noted that the width of the slits 35 is less than the span 37 between the silicon nitride spacers 34. It is also noted that each one of the slits 35 is between the sidewalls of the window 28 (FIGS. 2A and 3A) and the vertically extending portions of the silicon nitride spacers 34. The slits 35 and the span 37 between the silicon nitride spacers 34 expose surface portions 40 of the first silicon nitride layer 20 as shown in FIGS. 2C and 3C.

Figure 2D:
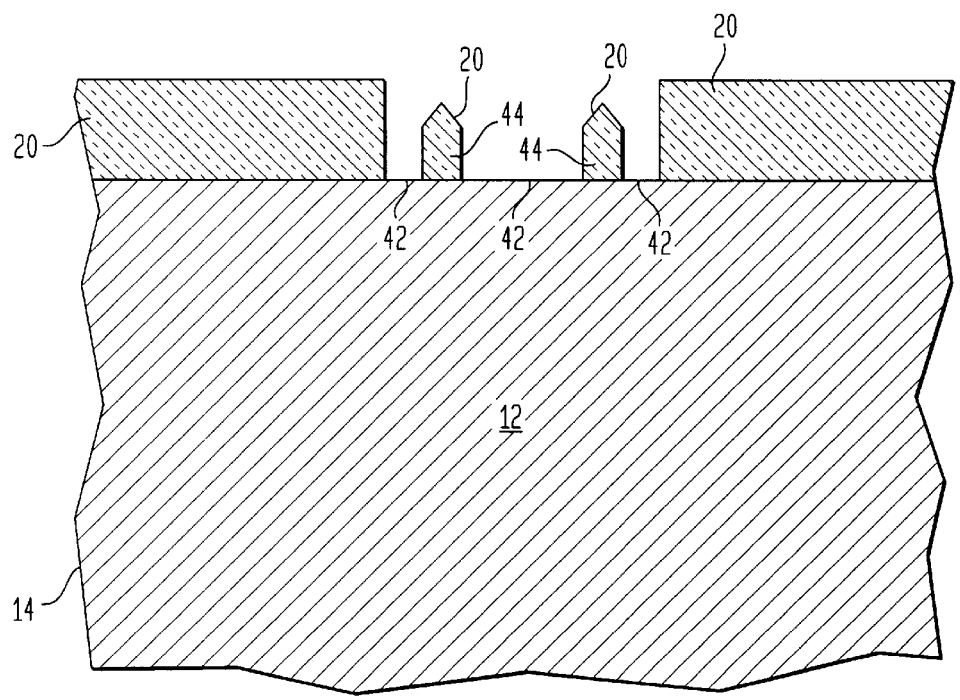
Figure 3D:
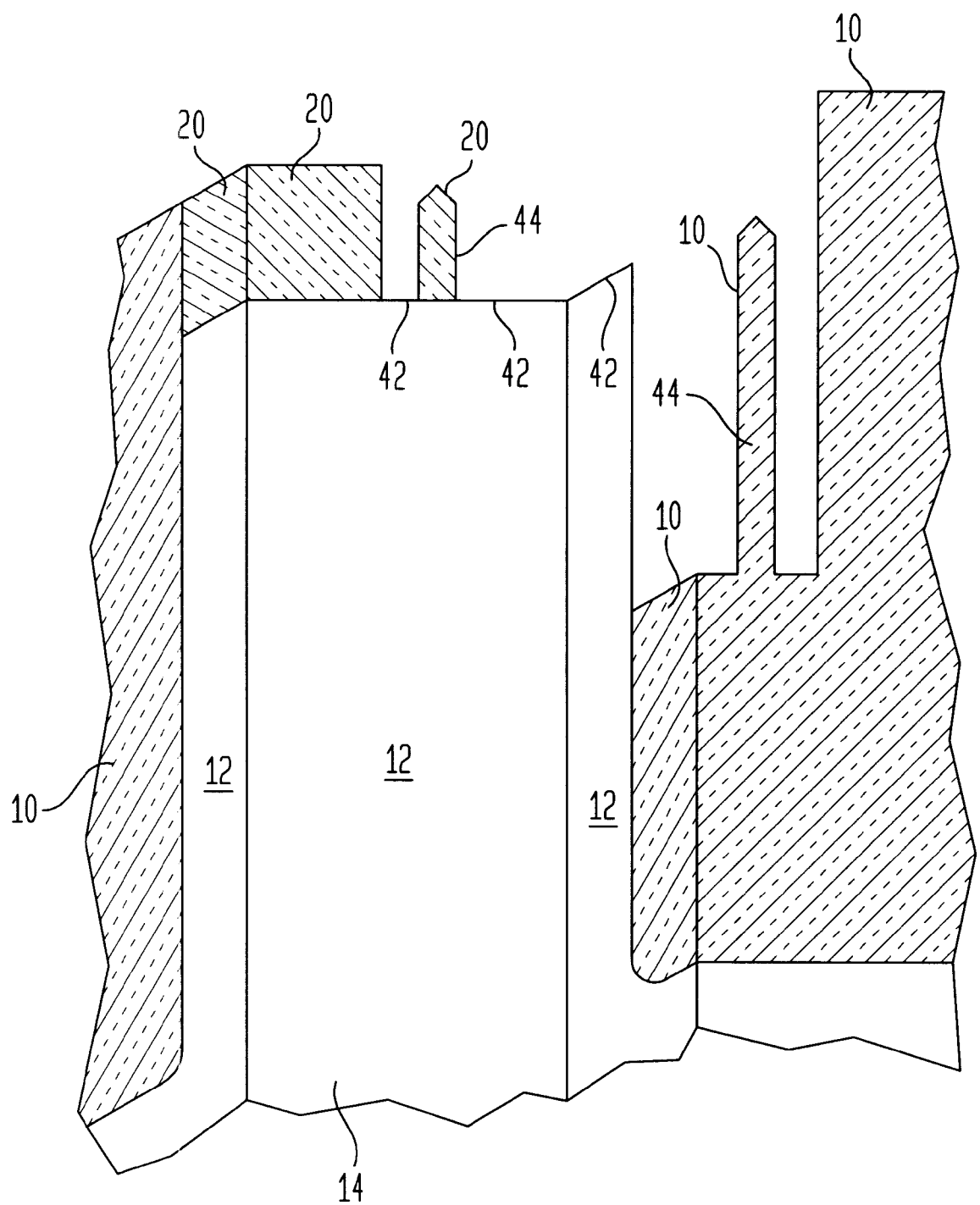

Next, the structure shown in FIGS. 2B and 3C is brought into contact with an anisotropic etch having a substantially higher etch rate to silicon dioxide relative to the silicon nitride (e.g., here a ratio of 4 to one). Here for example, the etch is a carbon fluoride chemistry (e.g., $CHF_3 + N_2 + O_2$). The etch is stopped after the exposed portions of the first silicon nitride layer 20 are etched through to expose underlying surface portions 42 (FIGS. 2D and 3D) of the silicon substrate 14. The resulting structure is shown in FIGS. 2D and 3D. It is noted that the etching process is used to (a) form a pair of horizontally spaced, vertically extending silicon nitride bars 44 (FIG. 2D) in the first silicon nitride layer 20, such bars 44 being positioned in regions of the first silicon nitride layer 20 disposed beneath the pair of vertically extending portions of the silicon nitride spacers 34 (FIG. 2C); (b) remove portions of the first silicon nitride layer 20 disposed beneath the slits 35 (FIG. 2C) to thereby expose underlying surface portions 42 (FIG. 2D) of the silicon semiconductor body 14 disposed beneath the slits 35; (c) remove the silicon dioxide layer 24 (FIG. 2C) and underlying second silicon nitride layer 22; and, (d) leave a portion of the first silicon nitride layer 20 disposed beneath the covered, non-windowed portion of the composite mask 21 (FIG. 2C), with the silicon nitride bars 44 and non-windowed portions of the first silicon nitride layer 20 providing a second silicon nitride mask over the horizontal surface of the semiconductor body 14, as shown in FIGS. 2D and 3D. It is also noted that, in addition to forming a pair of horizontally spaced silicon nitride bars 44, silicon dioxide spacers 44 are formed in the silicon dioxide in the STI regions 10, as shown in FIG. 3D. These silicon dioxide spacers 44 are removed with a short wet etch.

Figure 2E:
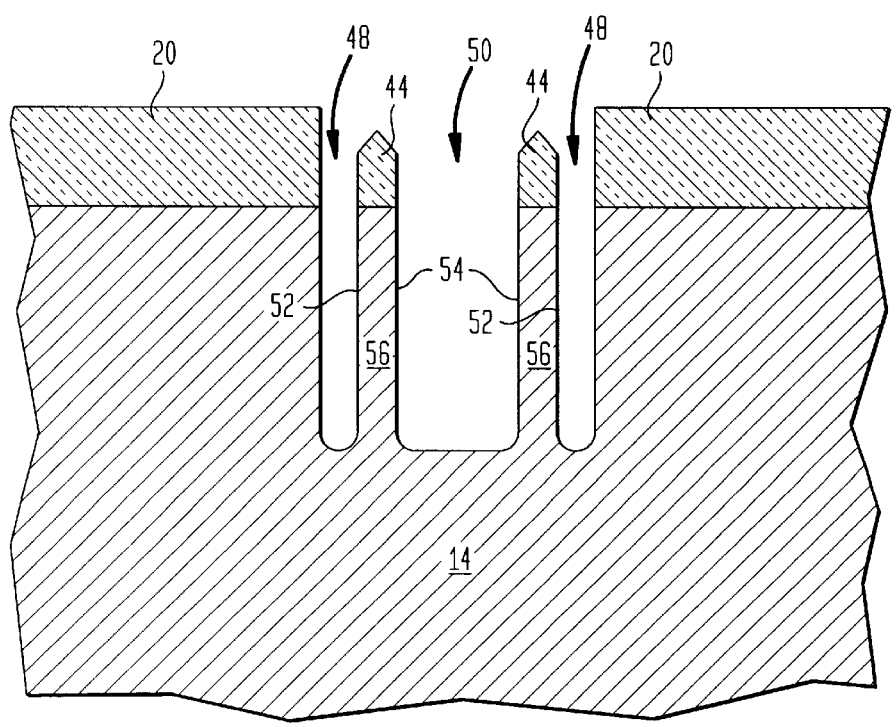
Figures 1, 2E:
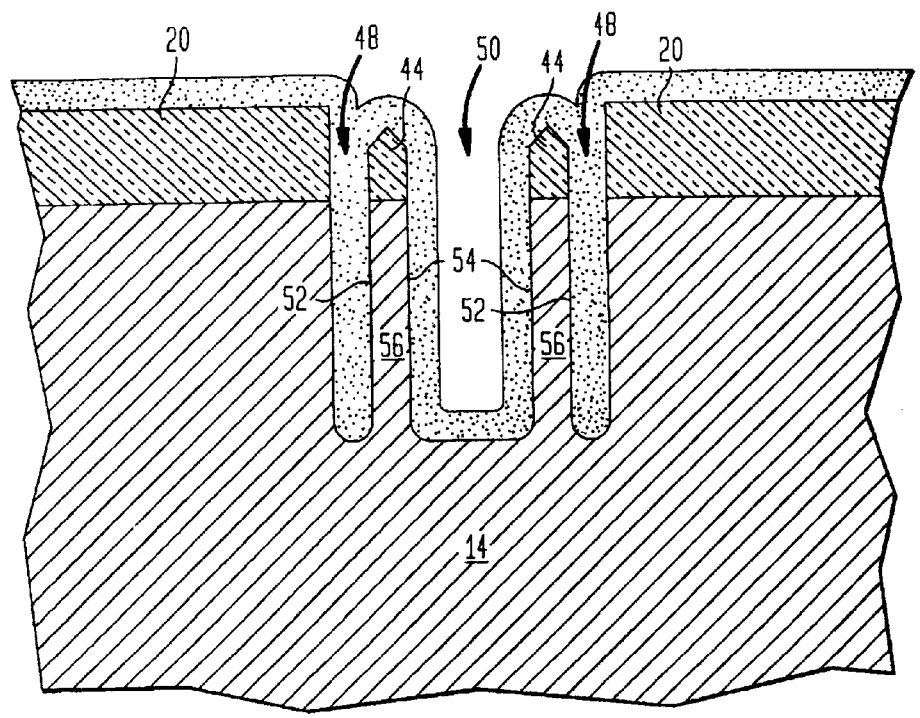

Next, using the patterned silicon nitride 20 as a mask, such mask being shown in FIG. 2D, an anisotropic etch (RIE) is used to selectively etch into the exposed surface portions of the semiconductor body 14 to form in such body 14 a pair of relatively narrow grooves 48 (FIG. 2E) under the surface portions of the semiconductor body 14 aligned with the slits 35 (FIG. 2C) and a relatively wide groove 50 in the semiconductor body 14 between such pair of narrow grooves 48. The resulting structure is shown in FIG. 2E. It is noted that each one of the pair of narrow grooves 48 has a sidewall 52 separated from an adjacent one of the sidewalls 54 of the wider groove 50 by portions 56 of the semiconductor body 14 disposed beneath the pair of bars 44 formed in the first silicon nitride layer 20. Further, each one of such portions 56 of the semiconductor body 14 will provide, in a manner to be described, an active area region for a corresponding one of a pair of transistors being formed in body 14. Thus, the width of the active area regions is defined by the thickness of the silicon nitride spacers 34, FIG. 3C), which defined the width of silicon nitride bars 44, rather than such width being defined by lithography.

Next, referring to FIG. 2E-1, a thin film 60 of polycrystalline silicon is chemically vapor deposited over the surface of the structure shown in FIG. 2E. Here, the thickness of the film 60 is more than one-half the width of the narrow trenches 48; i.e., here a thickness of more than 10 nm. It is noted that the thin film 60 of the deposited polycrystalline silicon is on the sidewalls of the wider trench 50.

Figures 2, 2E:
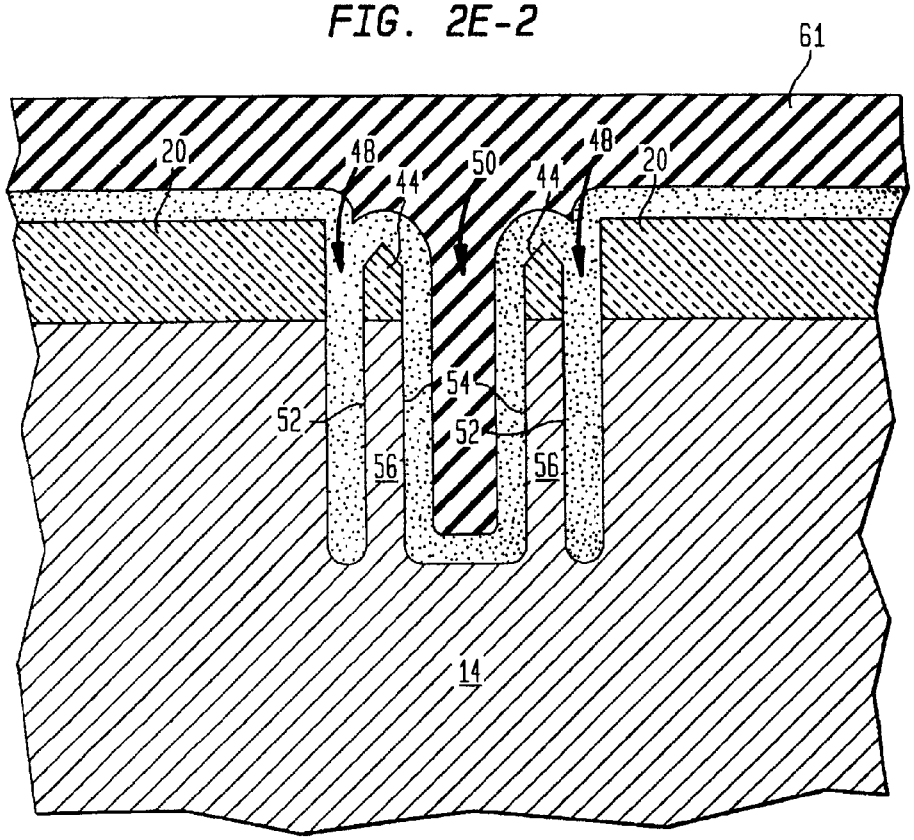

Next, referring to FIG. 2E-2, a layer 61 of photoresist is shown over the surface of the structure shown in FIG. 2E-1. It is noted that a portion of the photoresist layer 61 fills the polycrystalline film 60 coated, wider trench 50. The photoresist layer 61 is then isotropically etched back until it only fills the wider trench 50 using a timed etch (and known photoresist layer 61 (FIG. 2E-2) thickness) until the level of the photoresist is at the surface of the silicon body 14 to produce the structure shown in FIG. 2E-3.

Next, referring to FIG. 2E-4, the portions of the polycrystalline silicon film 60 are etched using a Reactive Ion Etch (RIE) until such film 60 is at the surface of the silicon body 14, as shown in FIG. 2E-4. The remaining portions of the photoresist layer 61 (FIG. 2E-4) are etched away to thereby produce the structure 5 shown in FIG. 2F.

Figures 2, 2E, 3:
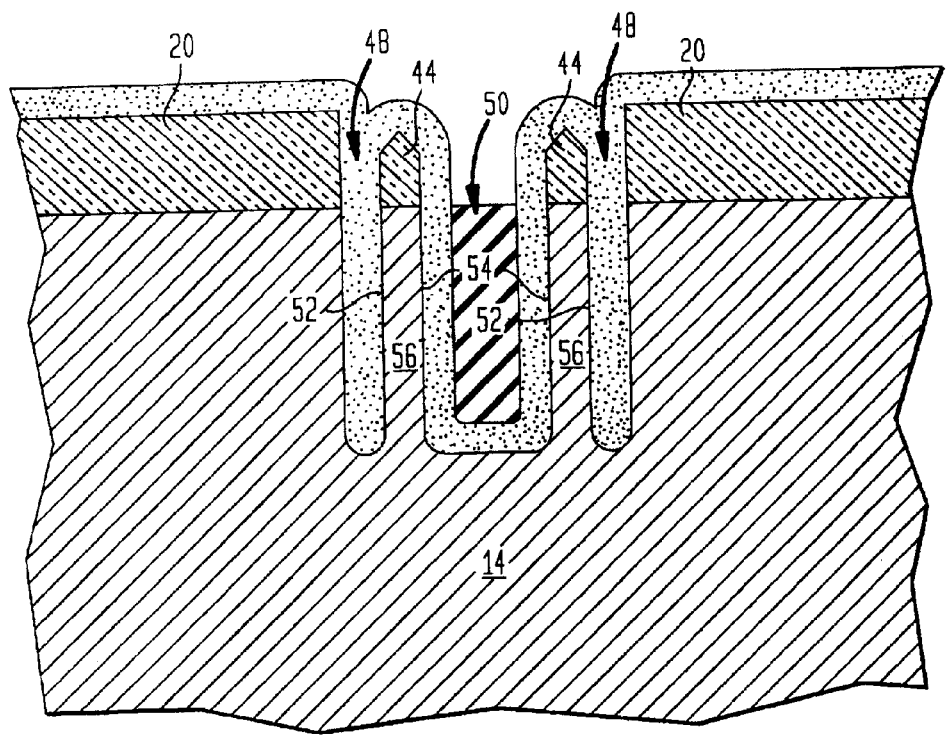
Figures 2, 2E, 3, 4:
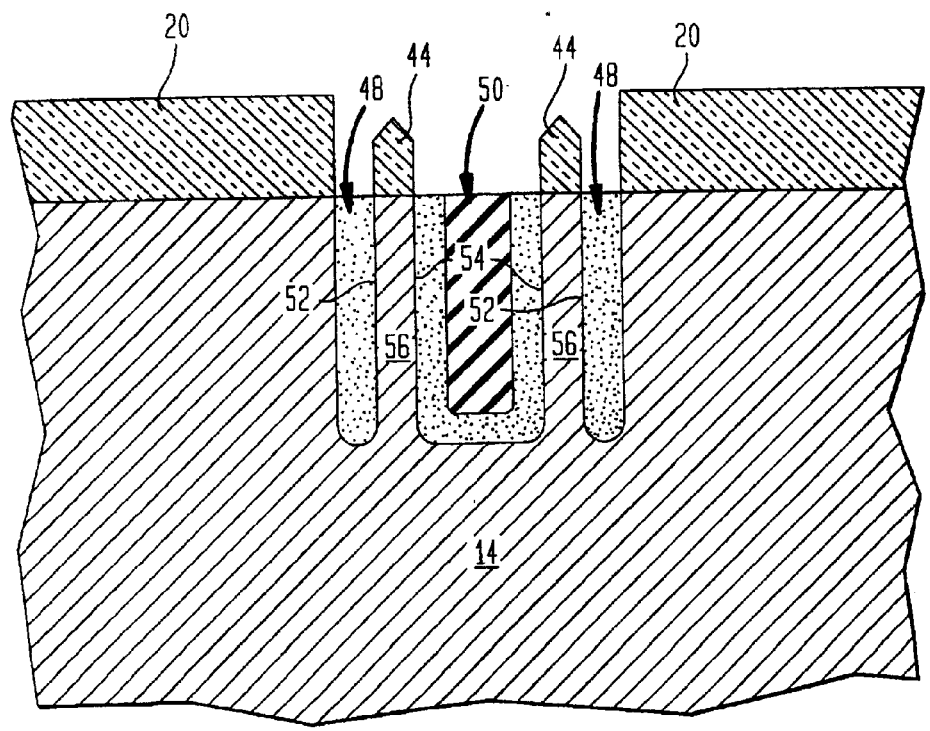
Figure 2F:
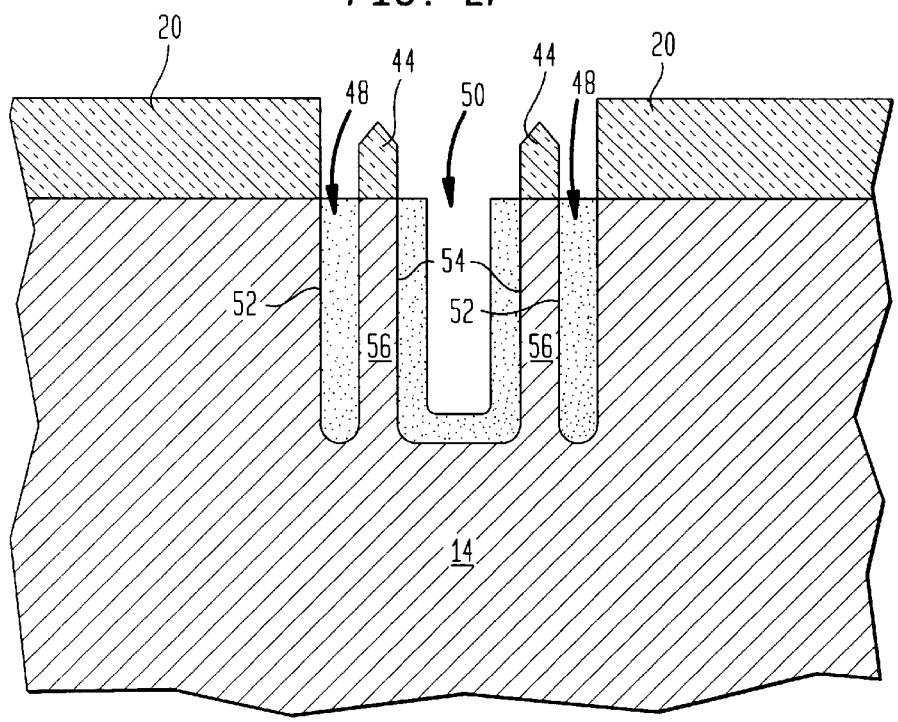

The deposited polycrystalline silicon film 60 is then anisotopically etched back with the narrow trenches 48 remaining filled with the deposited polycrystalline silicon 60, as shown in FIG. 2F. It is note that the thin film 60 of the deposited polycrystalline silicon still remains on the sidewalls of the wider trench 50.

Figure 2G:
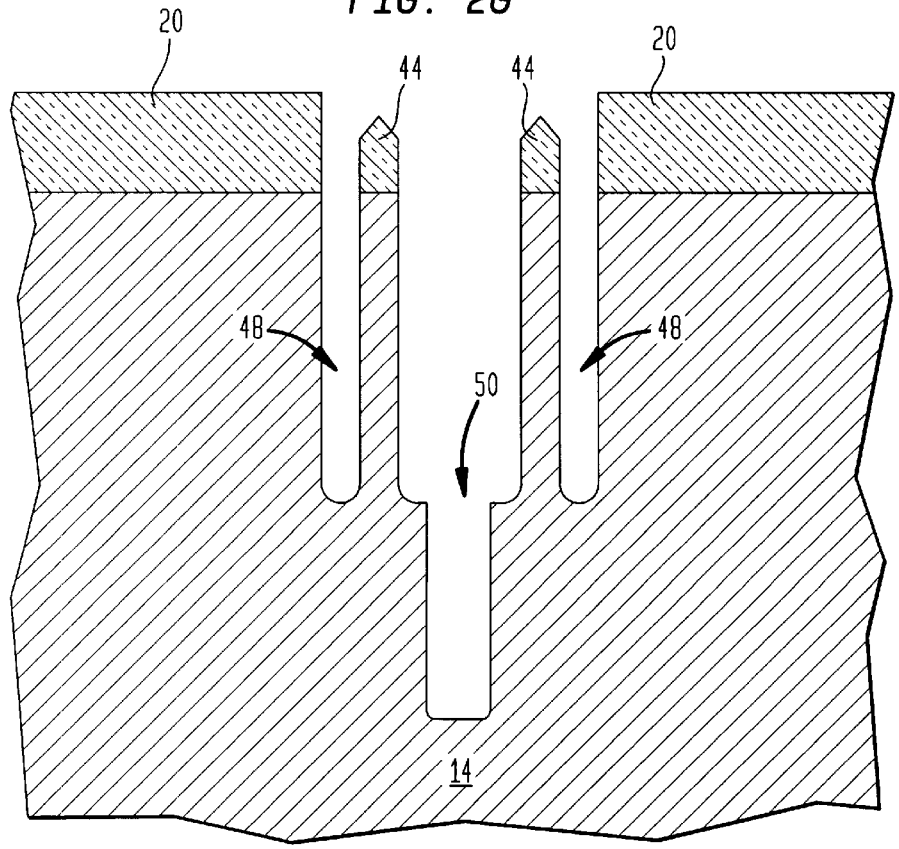

Next, referring to FIG. 2G, a second anisotropic, silicon etch is used to remove any remaining polycrystalline silicon 60, to deepen the pair of narrow grooves 48 in the semiconductor body 14, and to deepen the wider groove 50 in the semiconductor body 14. It is noted that the wider groove 50 is etched to a greater depth than the depth of the pair of relatively narrow grooves 48 because the bottom of the wider groove 50 has less polycrystalline silicon 60 that the narrower grooves 48. The resulting structure is shown in FIG. 2G.

Next, and referring to FIG. 2H, a gate oxide layer 52, here thermally grown silicon dioxide to a thickness of about 30–100 A, is formed on sidewalls and bottom portions of both the deepened pair of narrow grooves 48 and the wider groove 50 to line the walls of such pair of deepened grooves 48 and the wider groove 50 with such gate oxide layer 52. Next, a conductive material 54, here, for example doped polycrystalline or amorphous silicon, is deposited on the gate oxide layer 52 to provide such conductive material 54 in the gate oxide 52 lined pair of narrow grooves 48 and the wider groove 50. Here, the conductive material 54 is polycrystalline silicon and is sometimes referred to herein as POLY 1. The deposited conductive material 54 is etch back, as indicated in FIG. 2H. A dielectric layer 57, here silicon dioxide, is deposited over the structure and planarized using conventional techniques to produce the structure shown in FIG. 2H.

Next, the remaining portions of the first silicon nitride layer 20 are removed using a selective etch, here hot phosphoric acid, for example, to thereby expose underlying portions of the silicon substrate 14. The resulting structure is shown in FIG. 2I. It is noted that there are three regions of POLY 1; region 54a which is the groove 50 (FIG. 2G), a region 54b1, 54b2, which are in narrow grooves 48.

Referring to FIG. 2J, using the silicon dioxide layer 57 as a mask, the exposed single crystal silicon semiconductor body 14 is selectively anisotropically to form a pair of horizontally spaced recesses 63 in such body 14. The recesses 63 have bottom portions 62 at depth in the semiconductor body 14 deeper than the depth of the pair of narrow groves but less than the depth of the relatively wide groove 50. Portions of the semiconductor body 14 covered with the silicon dioxide layer 57 remain to retain provide portions 56 (FIGS. 2E and 2J) of the semiconductor body 14 between the pair of gate oxide layer 52 lined narrow grooves 48 and wider groove 50 and to maintain in regions 56 the pair of active area regions for the pair of transistors.

Referring now to FIG. 2K, a layer 64 of silicon dioxide having a thickness of here 20 nm is conformally deposited over the structure shown in FIG. 2J. The resulting structure is subjected to a selective anisotropic etch to remove horizontal portions of the silicon dioxide layer 64 while leaving portions of the silicon dioxide layer 64 on sidewall portions of the recesses 63 to cover such sidewall portions as indicated in FIG. 2K.

Next, the structure shown in FIG. 2K is subjected to a silicon selective anisotropic etch to extend the depth of the recesses 63 to a depth greater than the depth of the wider groove 50. That is the bottom 65 of the recesses 63 are at a depth lower than the bottom 66 of the wider groove 50. The resulting structure is shown in FIG. 2L. It is noted that sidewalls 68 of the depth extended recesses 63 of the semiconductor body 14 are formed between terminating ends of the layer 64 and bottoms 65 of the depth extended recesses 63.

Figure 2M:
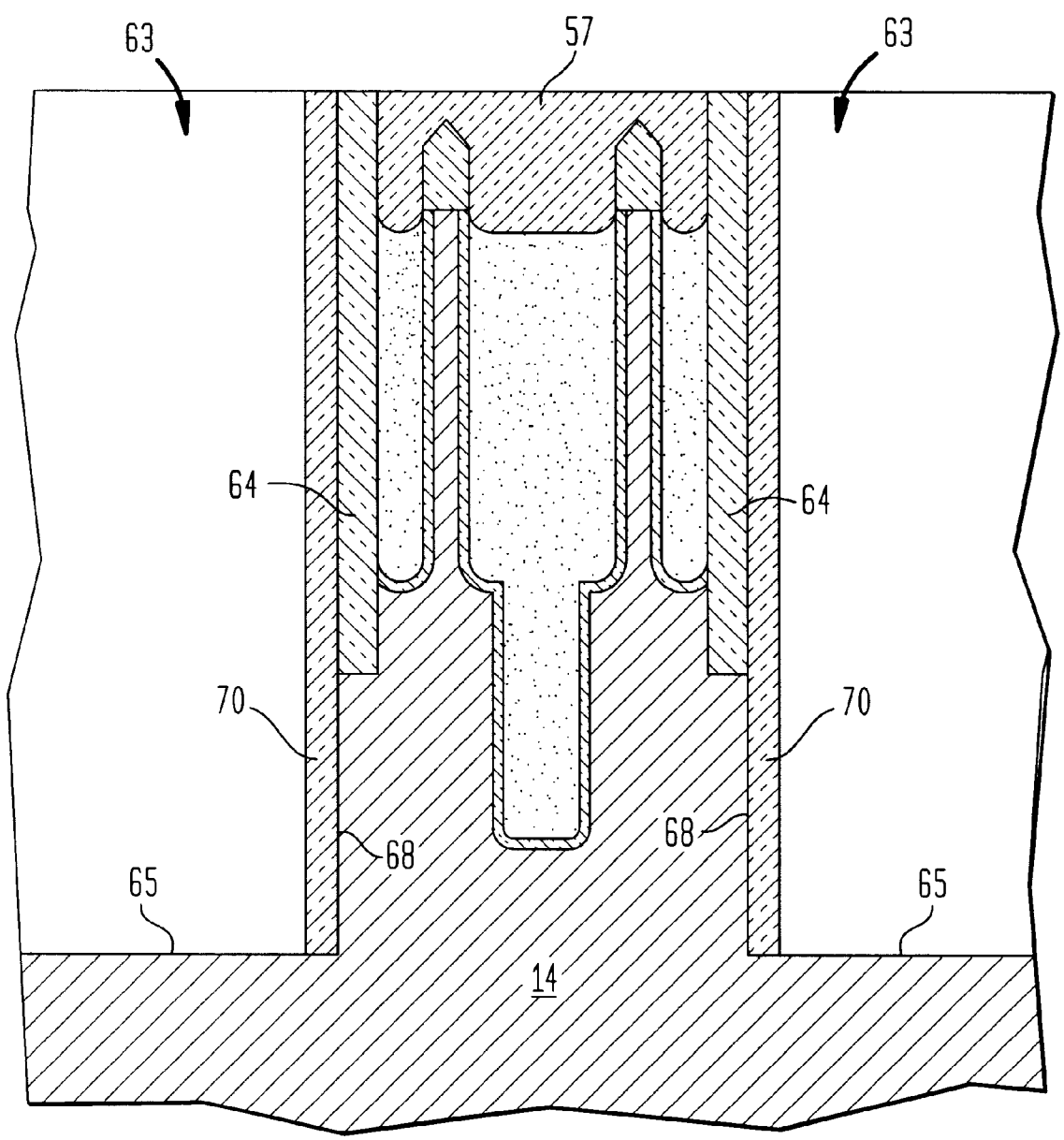

Next, and referring to FIG. 2M, a silicon nitride spacer layer 70 is deposited over the structure and patterned to leave portions thereof on the sidewalls 68 of the pair of extended recesses 63. It is noted that portions of the remaining silicon nitride spacer 70 layers are formed on the silicon dioxide layers 64 and other portions of the remaining silicon nitride spacer layers 70 are formed on the single crystal silicon semiconductor body 14 sidewalls 68 of the depth extended recesses 63 of the semiconductor body 14 (i.e., the recess sidewall formed between terminating ends of the silicon nitride spacer layers 64 and bottom portions of the depth extended recesses 63).

Figure 2N:
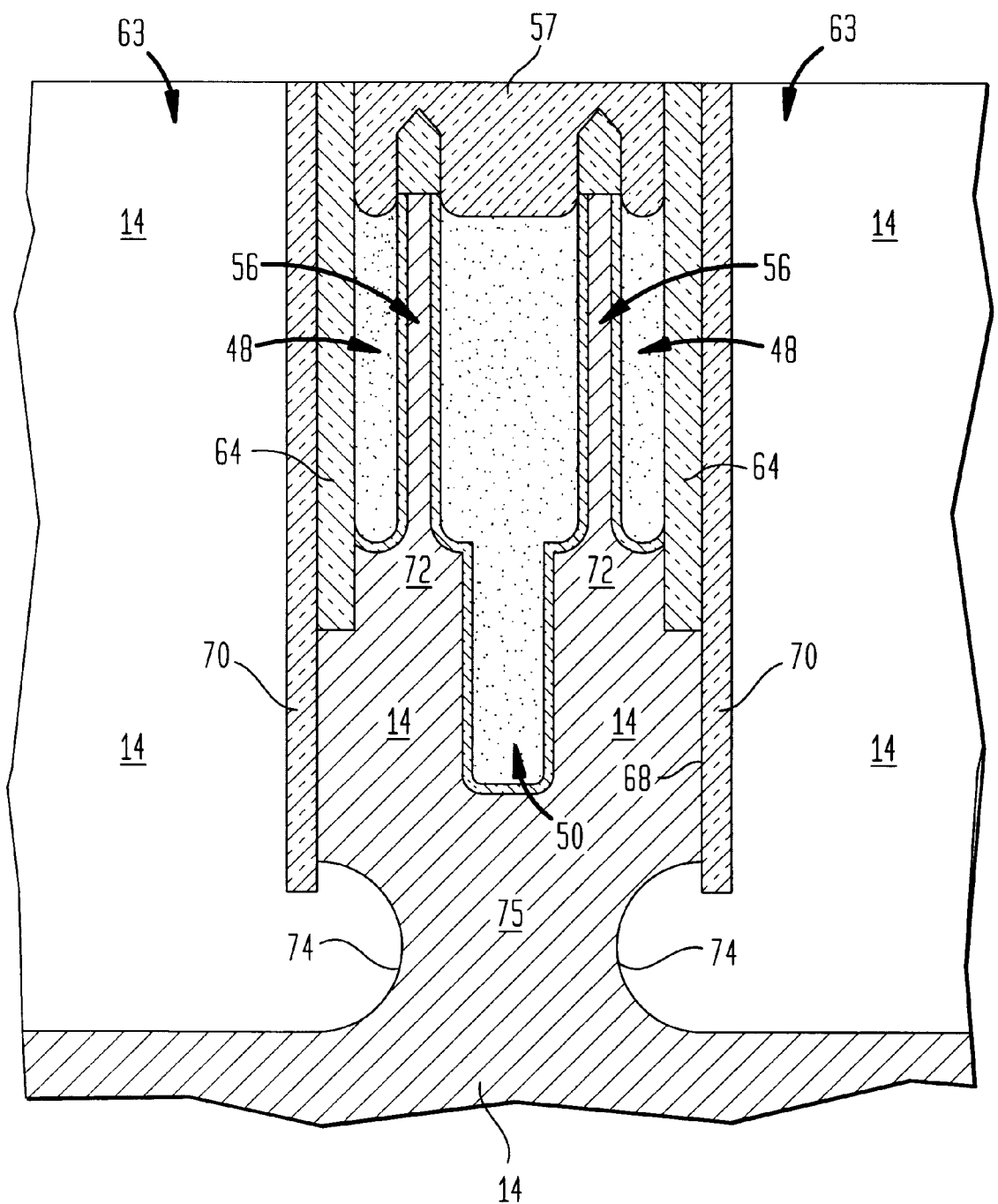
Figure 20:
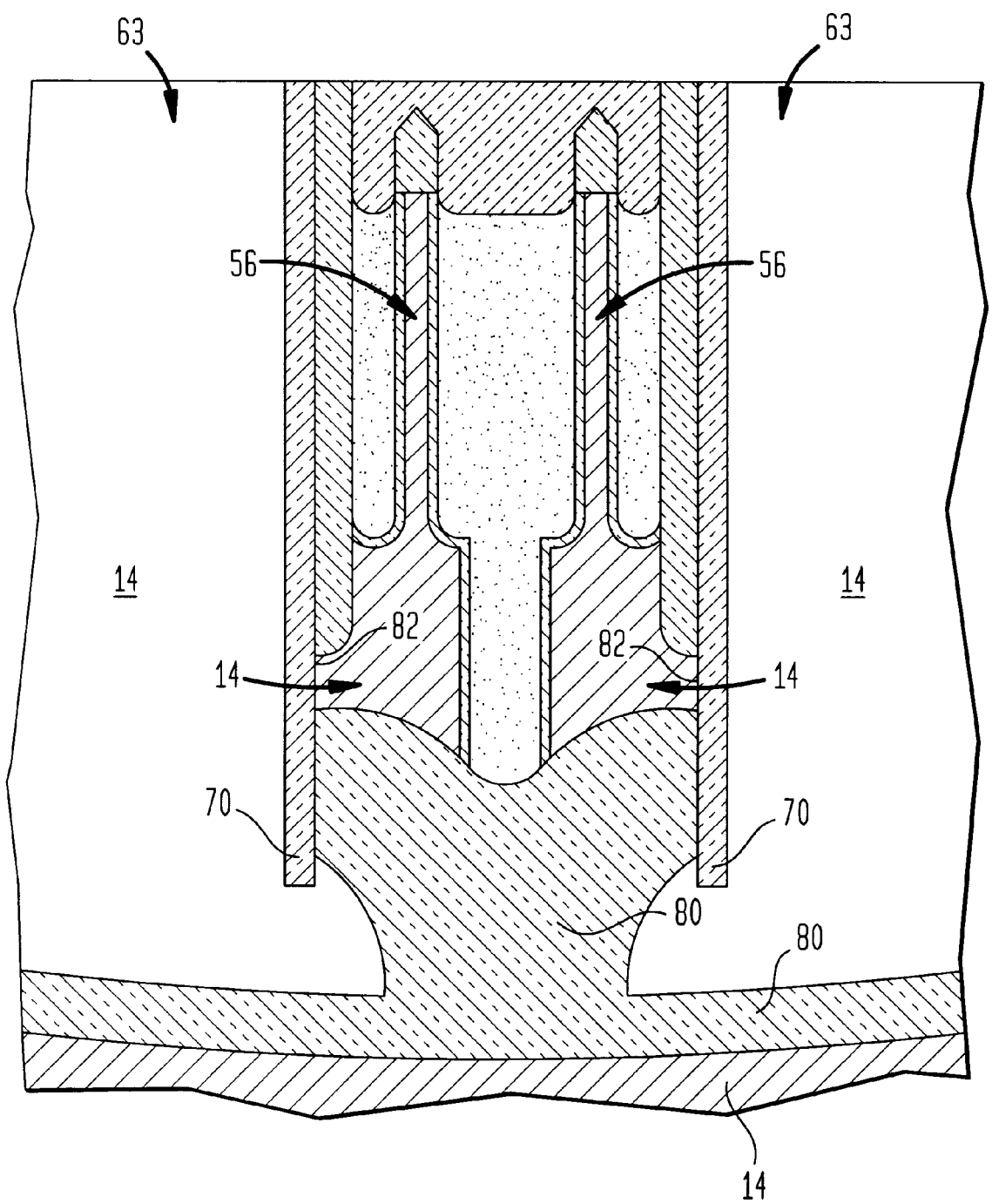
Figure 3N:
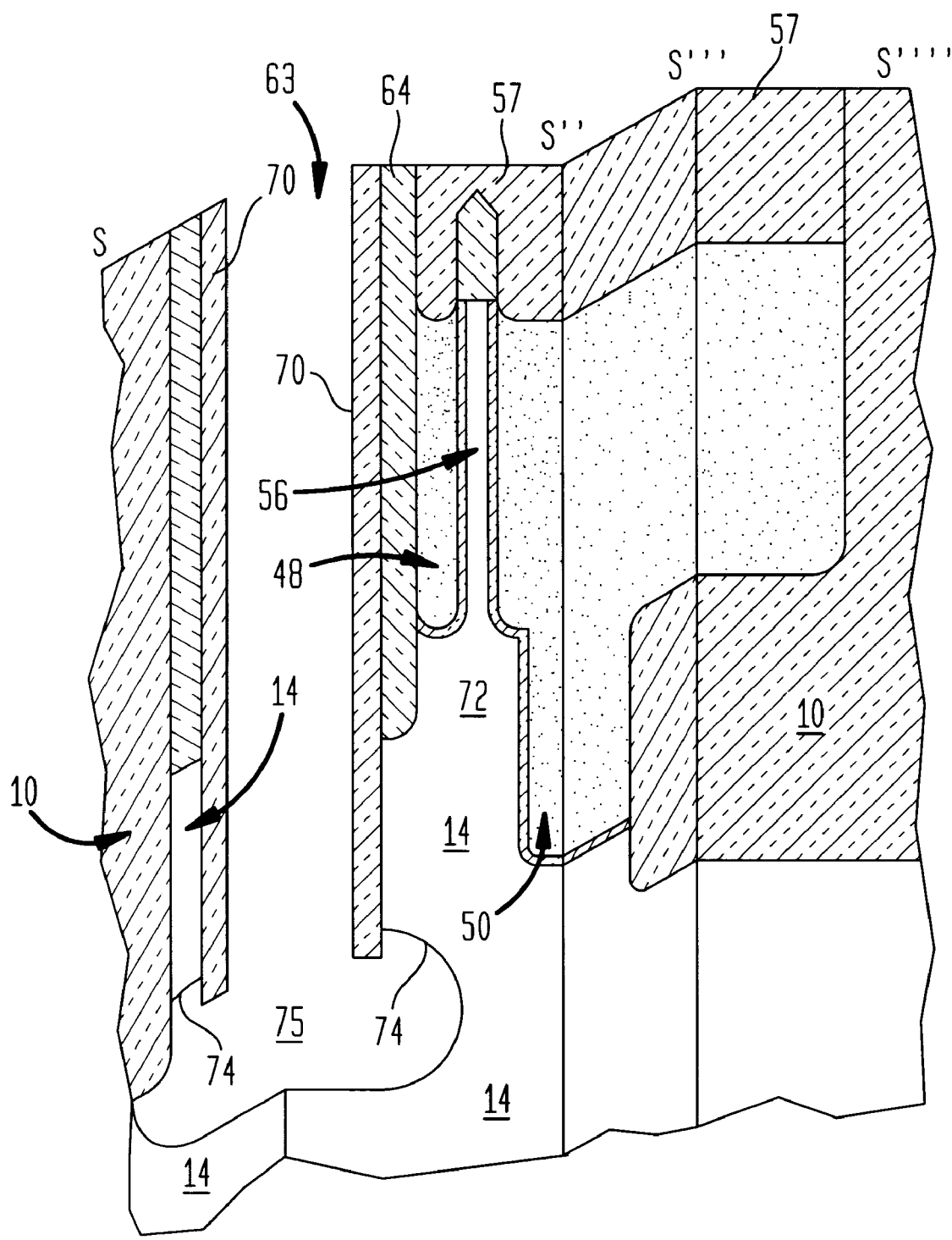
Figure 4:
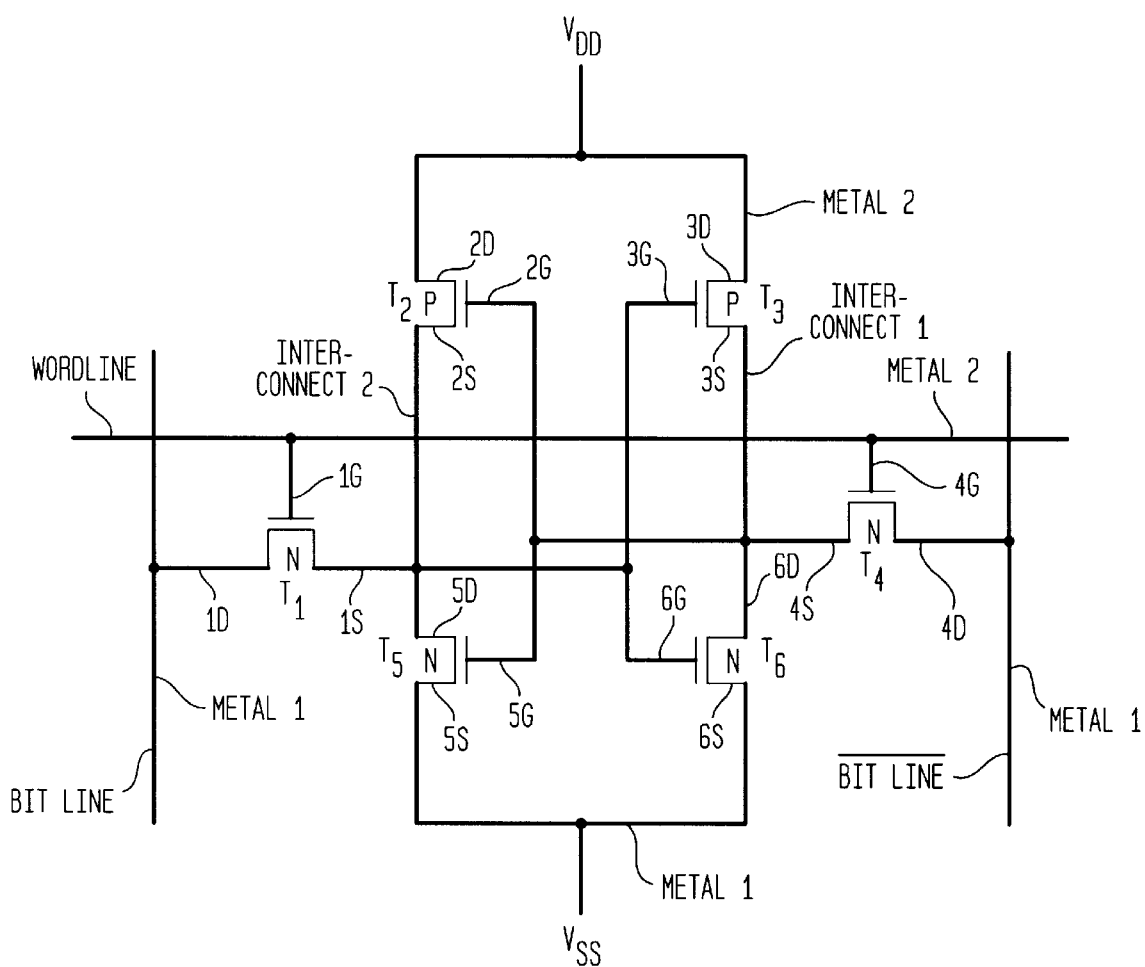

Next, the structure shown in FIG. 2N is brought into contact with a silicon selective isotropic etch. That is, an isotopically etch is brought into contact with the portions of the semiconductor body 14 on the bottom portions 65 of the recesses 63. The isotropic etch removes portions of the semiconductor body 14 beneath the wider groove 50 and only lower portions of the semiconductor body 14 beneath the pair of narrow grooves 48 to thereby leave, in un-etched semiconductor body 14: (a) portions 56 of the semiconductor body 14 providing the active areas for the transistors; and (b) upper portions 72 of the semiconductor body 14 beneath the pair of narrow grooves 48. The resulting structure is shown in FIG. 2N. It is noted that the etch etches the semiconductor body 14 to a level 74, (i.e., level 74) is the bottom surface of the portion of the silicon body 14 disposed beneath the silicon dioxide layer 57. Another view of the structure at this point in the process is shown in FIG. 3N and is a cross-section taken similar to that used in FIGS. 3A–3D. It is noted that a void 75 is formed in the silicon body 14.

Next, referring to FIG. 2O, exposed portions of the single crystal silicon body 14 are thermally oxidized forming a dielectric (i.e., here the thermally grown silicon dioxide, layer 80 over bottom portions of the un-etched semiconductor body 14. It is noted that side portions 82 of such un-etched semiconductor body 14 are separated from the recesses 63 formed in the semiconductor body 14 by portions of the silicon nitride spacer layer 70 previously formed on the sidewalls of such recesses 63. These silicon nitride spacer layers 70 are etched away with a selective etch to expose the side portions 82 of the un-etched semiconductor body 14, as shown in FIG. 2P.

Figure 2P:
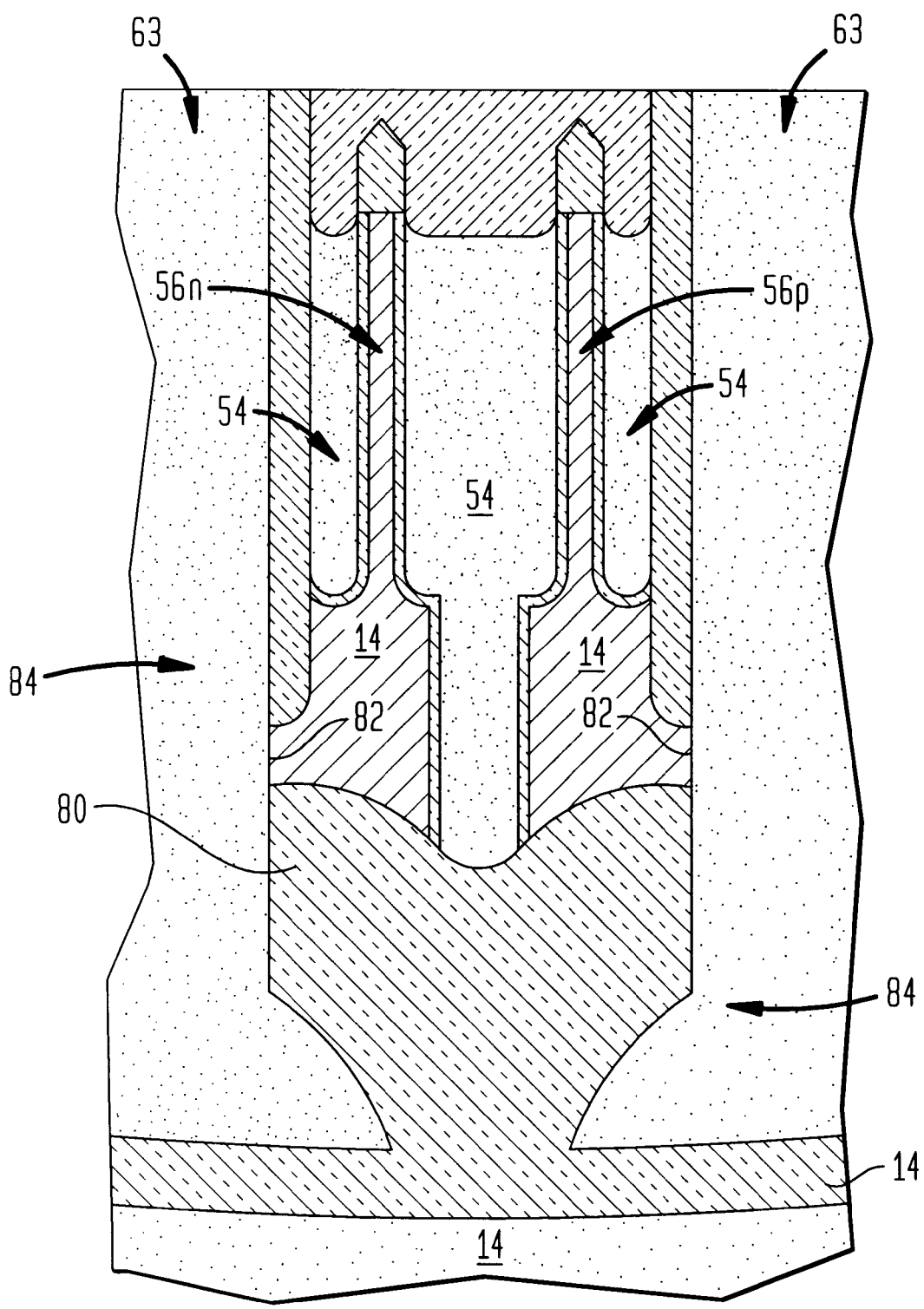
Figures 1, 2P:
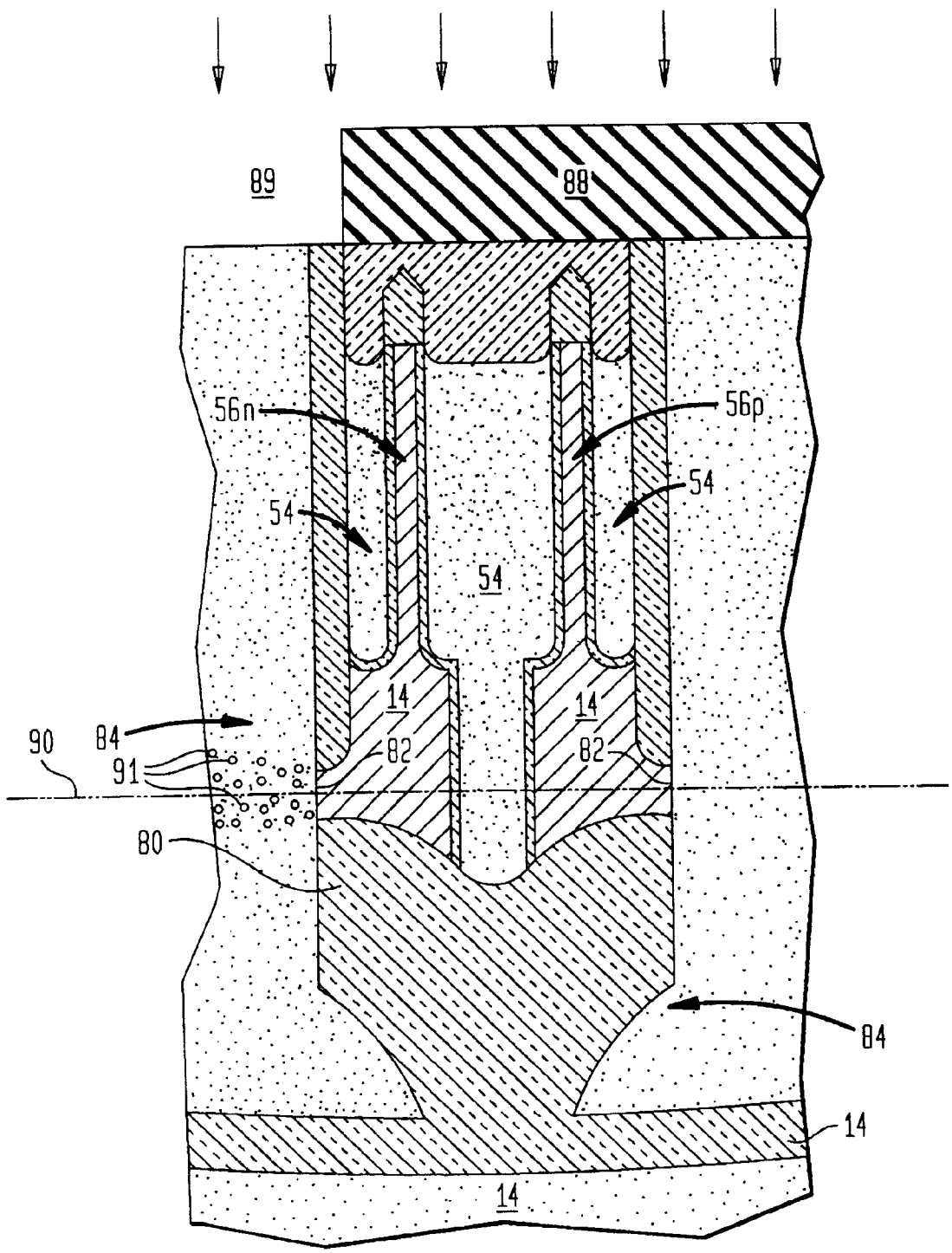
Figures 2, 2P:
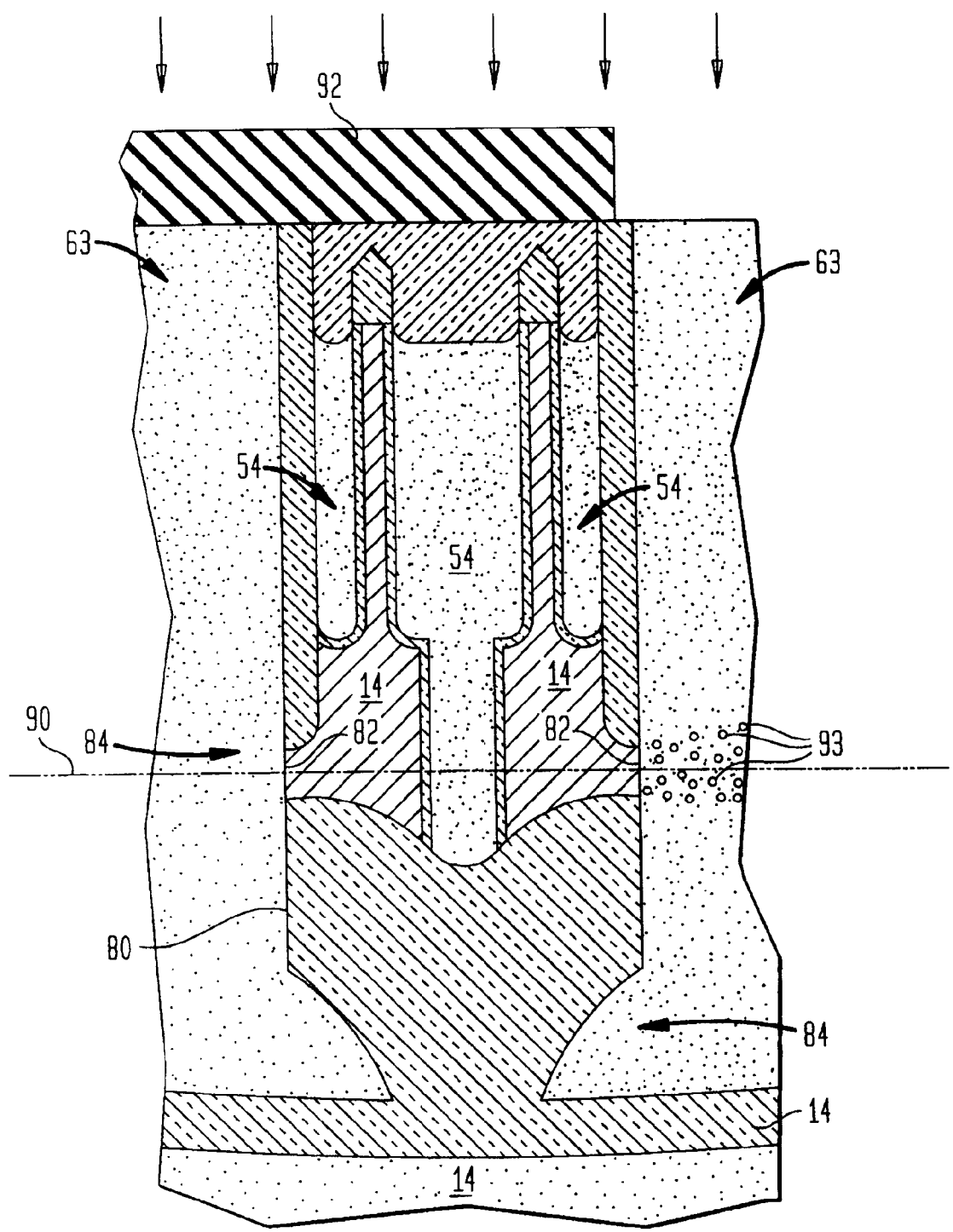

Next, as shown in FIG. 2P, a host material 84, here un-doped polycrystalline silicon is deposited over the structure shown in FIG. 2O. The material 84 is etched back yet remains to fill the recesses 63 as shown in FIG. 2P. It is noted that portions of the host material 84 are in contact with the side portions 82 of the un-etched semiconductor body 14. It is also noted that the left and right portions of the host material, i.e., 84L, 84R, respectively, are dielectrically separated by the dielectric 80. As will be described, the n-channel one of a pair of CMOS field effect transistors (FETs) will be formed in the left active area region 56 (FIG. 2O), here in FIG. 2P designated 56n, and the p-channel one of a pair of CMOS field effect transistors (FETs) will be formed in the right active area region 56 (FIG. 2O), here in FIG. 2P designated 56p.

Figure 2Q:
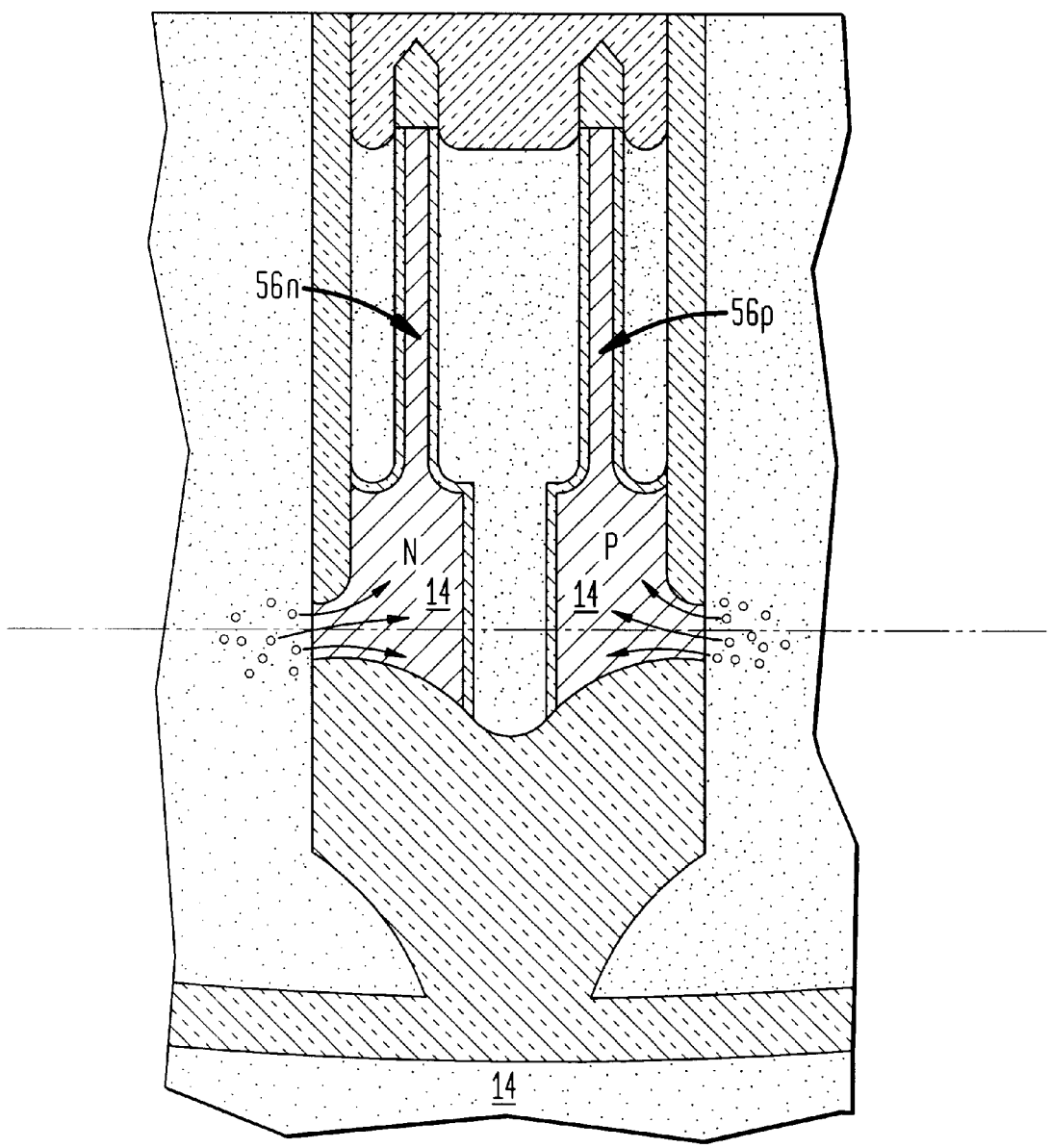

Thus, next, a first Source/Drain photoresist mask 88 (FIG. 2P-1) is deposited over the structure shown in FIG. 2P and patterned to provide a window 89 over the left portion of the host material 84. The structure is exposed to an ion implantation of n-type dopant, e.g., arsenic or phosphorous ions. The ions are implanted into the left portion of host material 84 (i.e., 84L), to a depth at the side portions 82, such depth being indicated by dotted line 90. The implanted ions are designated by numeral 91. The mask 88 is removed and replaced with mask 90 (FIG. 2P-2). The structure is exposed to an ion implantation of a p-type dopant, e.g., boron ions. The ions are implanted into the right portion of host material 84 (i.e., 84R) to the depth at the side portions 82, such depth being indicated by dotted line 90. The implanted ions are designated by numeral 93. The mask 90 is removed. The structure is heated at an elevated temperature to activate the n-type and p-type ions and to diffuse, or drive them from the host materials, through the side portions (i.e., buried contact regions) of the un-etched semiconductor body, into adjacent, lower portions of the un-etched semiconductor body, as indicated in FIG. 2Q and through the polycrystalline silicon host 84 to the upper surface of the silicon body 14. Thus, N-type conductivity and p-type conductivity region N and P, respectively are formed at the bottom regions of active areas 56n, 56p, respectively, and the un-doped polycrystalline silicon 84 is now doped polycrystalline as a result of the implantation and heating steps. This now doped polycrystalline silicon 84 is sometimes referred to herein as POLY 2.

Figure 2R:
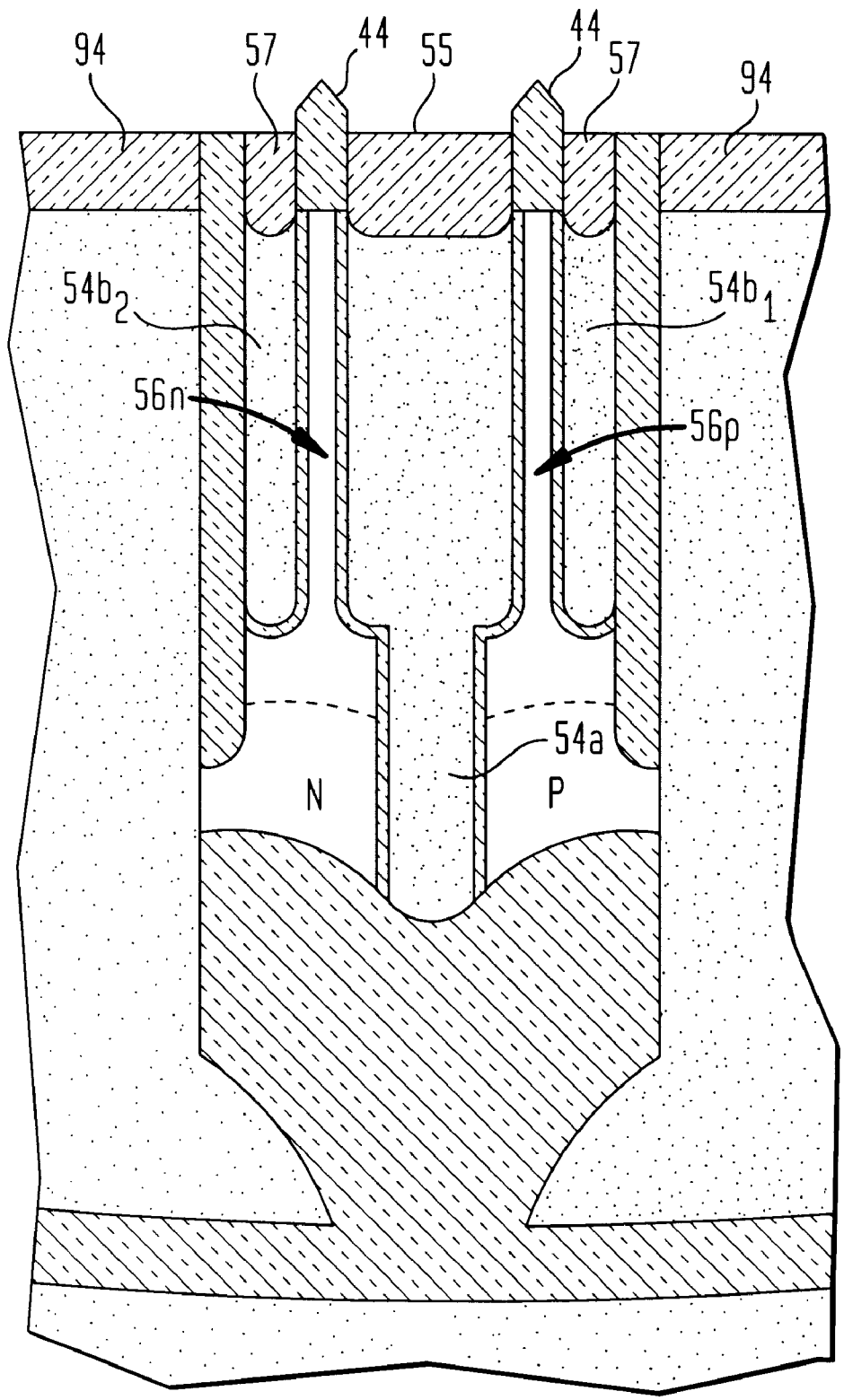

Next, referring to FIG. 2R, a layer 94 of silicon dioxide is conformally deposited over the structure and etched back or chemically mechanically polished to remove upper portions thereof to provide the structure shown in FIG. 2R. It is noted that the process exposes upper portions of the silicon nitride bars 44.

Figure 2S:
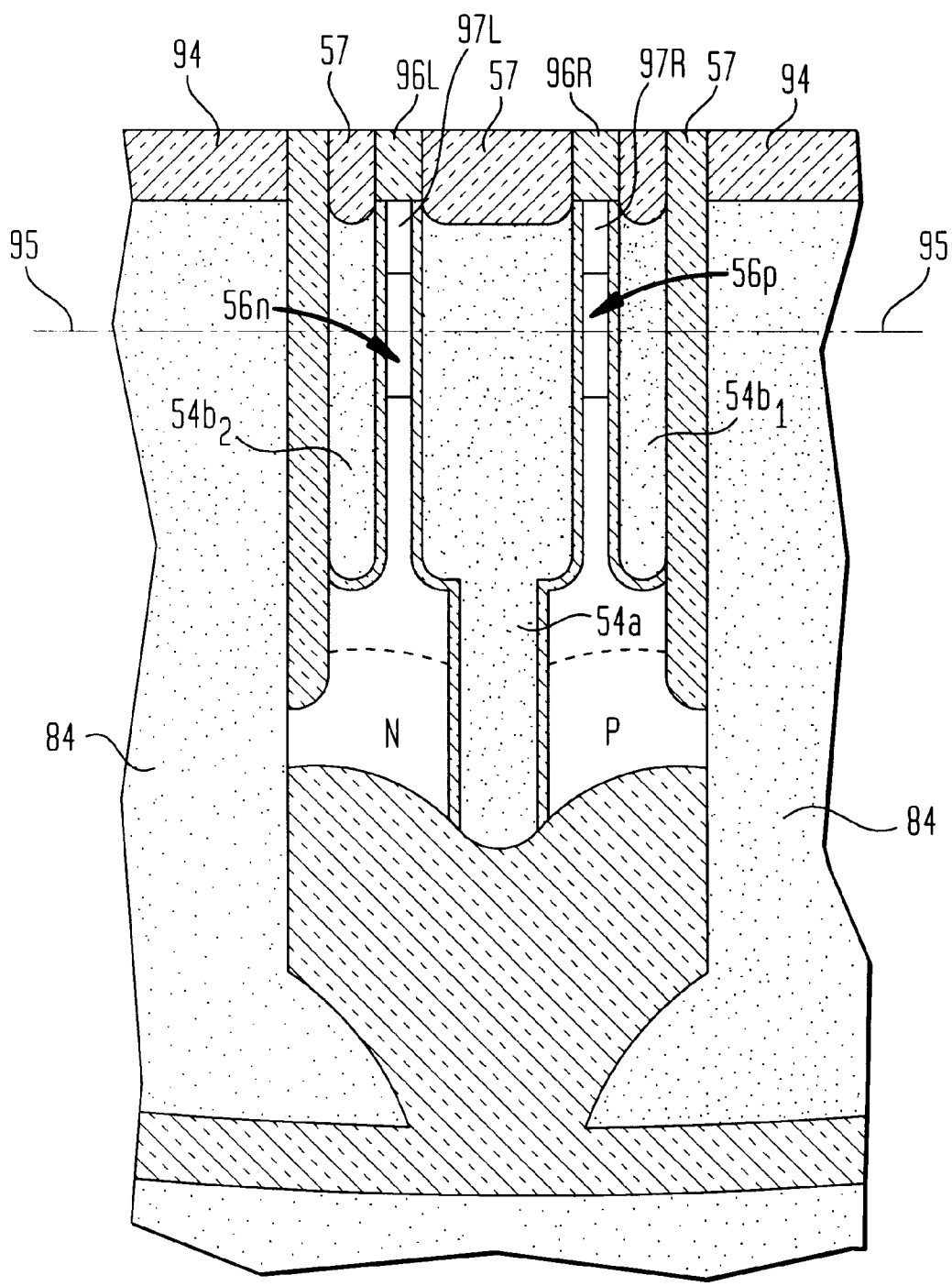

The exposed portions of the silicon nitride bars 44 are brought into contact with an etch, for example hot phosphoric acid, to selectively remove such bars 44 and expose surface portions of the active area regions 56n, 56p of the semiconductor body 14. A thin film 96L, 96R of a host material, here doped polycrystalline silicon, is conformally deposited over the resulting structure and then etched back as shown in FIG. 2S. Thus, the host material of film 96L, 96R fills the space previously occupied by the silicon nitride bars 44. It is noted that other electrically conductive material may be used instead of the doped polycrystalline film 96L, 96R. Using a photoresist mask, not shown, the exposed n-channel transistor polycrystalline silicon material 96L over the active area region 56n is implanted with arsenic or phosphorous. With such mask, boron or other p-type dopant, is implanted into the active area region 56n to a depth indicated by dotted line 95. The photoresist mask, not shown, is removed and replaced with a photoresist mask, not shown, to implant the exposed p-channel transistor polycrystalline silicon material 96R over the active area region 56p boron. With such mask, the exposed p-channel transistor polycrystalline silicon material 96R over the active area region 56p is implanted with boron, or other p-type dopant. With such mask, phosphorous, arsenic or other n-type dopant, is implanted into the active area region 56p to the depth indicated by dotted line 95. The photoresist mask, not shown, is removed. The structure is heated so that the n-type dopant in the polycrystalline silicon material 96L and the p-type dopant in the polycrystalline silicon material 96R is driven into the source/drain region 97L of the n-channel transistor and the n-type dopant in the polycrystalline silicon material 97R is driven into the source/drain region 97R of the p-channel transistor. Thus, FIG. 2S shows a pair of electrically isolated, dual gated, vertical CMOS transistors.

Referring now to FIG. 4, an Synchronous Random Access (SRAM) cell is shown having an arrangement of transistors $T_1$–$T_6$. Here, transistors $T_2$ and $T_5$ are configured as one such pair of transistors shown in FIG. 2S. Transistors $T_3$ and $T_6$ are configured as another one of the pair of transistors shown in FIG. 2S. Transistor $T_1$ is one of the pair of transistors in FIG. 2S, the other one of the pair, not shown in FIG. 4, being used in a neighboring cell. Transistor $T_4$ is one of the pair of transistors in FIG. 2S, the other one of the pair, not shown in FIG. 4 being used in another neighboring cell. Here, transistors $T_2$ and $T_3$ are n-channel MOSFETS, and transistors $T_1$, $T_4$, $T_5$ and $T_6$ are p-channel MOSFETS. The voltage source $V_{ss}$ is connected to the sources 5S, 6S of transistors $T_5$, $T_6$ respectively, by a METAL 1 electrical conductor. A BIT LINE (BL) is connected to the drain 1D of transistor $T_1$ by the METAL 1 electrical connector. AB ITLINE (BI) is connected to the drain 4D of transistor $T_4$ by the METAL 1 electrical connector. The voltage source $V_{DD}$ is connected to the drains 2D and 3D of transistors $T_2$ and $T_3$, respectively, by a METAL 2 electrical connector. A WORDLINE (WL) is connected to the gates 1G, 4G by the METAL 2 electrical connector. The source 3S of transistor $T_3$, the source 4S of transistor $T_4$, the drain 6D of transistor $T_6$, the gate 2G of transistor $T_2$ and the gate 5G of transistor $T_5$ are connected together by an INTERCONNECT 1. The gate 3G of transistor $T_3$, gate 6G of transistor $T_6$, source 2S of transistor $T_2$, drain 5D of transistor $T_5$ and source 1S of transistor $T_1$ are connected together by INTERCONNECT 2.

Figure 5A:
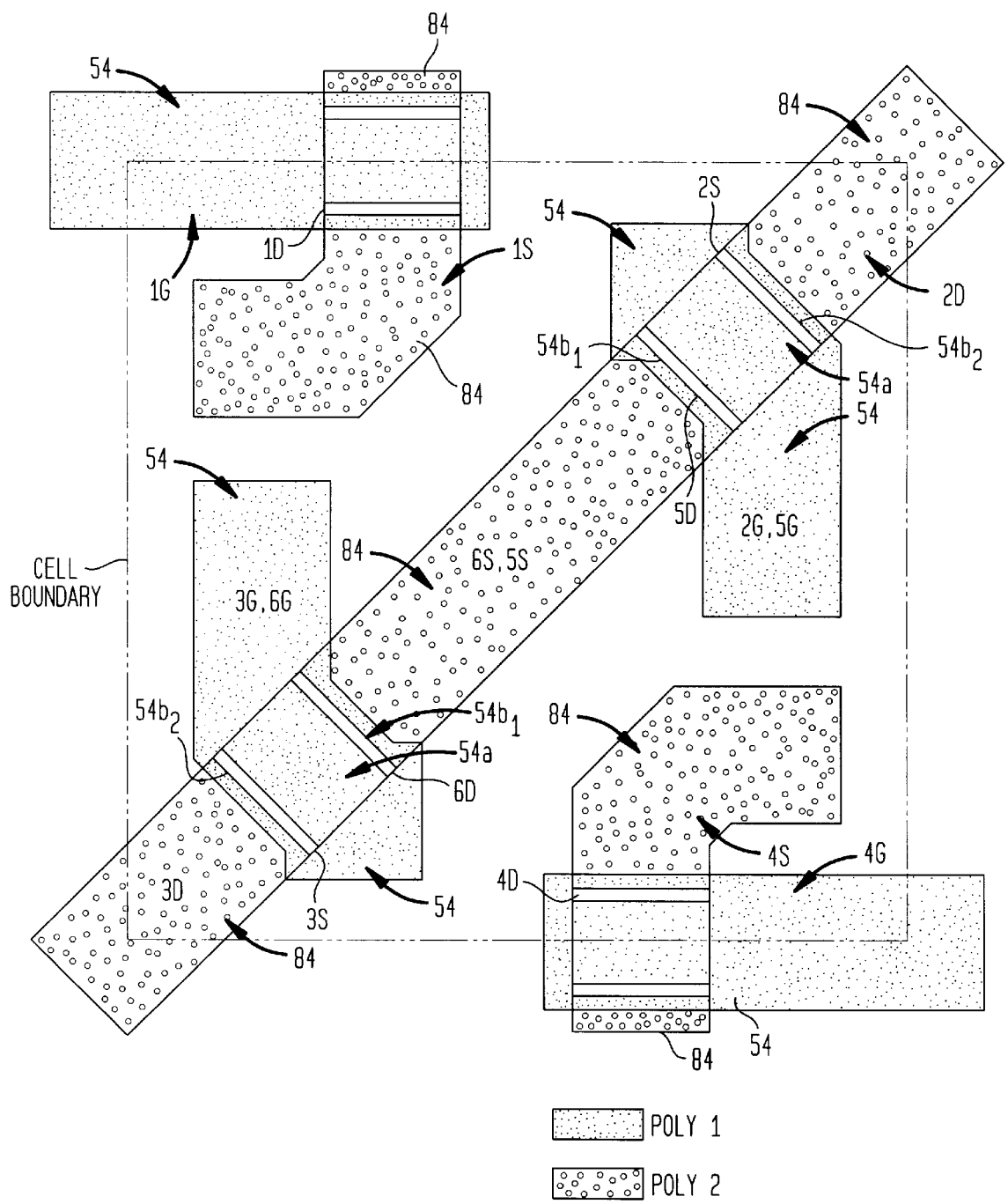
FIGS. 5A–5B and 5F–5G are plan views of the SRAM cell of FIG. 4 in the semiconductor body of FIG. 1 at various stages in the fabrication thereof in accordance with the invention.

Referring now to FIG. 5A, a layout of the SRAM cell of FIG. 3 is shown, such layout showing the drains, sources and gates of the transistors $T_1$–$T_6$. More particularly, it is noted that the POLY 1 regions 54 provide the gates 1G–5G of transistors $T_1$–$T_6$, respectively. It is noted that the POLY 1 regions 54a, 54b1 and 54b2, are electrically connected together for each one of the transistors $T_1$–$T_6$. Thus, each one of the transistors $T_1$–$T_6$ has a pair of gate electrodes provided by region 54a and either 54b1 or 54b2, each one of the gates being on opposite sides of the gate channel region for the transistor. The source regions 2S and 3S for transistors $T_2$ and $T_3$, respectively, are should as black bars. Likewise, the drain regions 1D, 2D, 4D, 5D, and 6D of transistors $T_1$, $T_2$, $T_4$, $T_5$, and $T_6$, respectively are shown as black bars. The source regions 1S, 4S, 5S, and 6S are provided by the doped POLY 2 regions 84. Likewise, the drain regions 2D and 3D for transistors $T_2$ and $T_3$, respectively, are provided by doped POLY 2 regions 84.

Figure 5B:
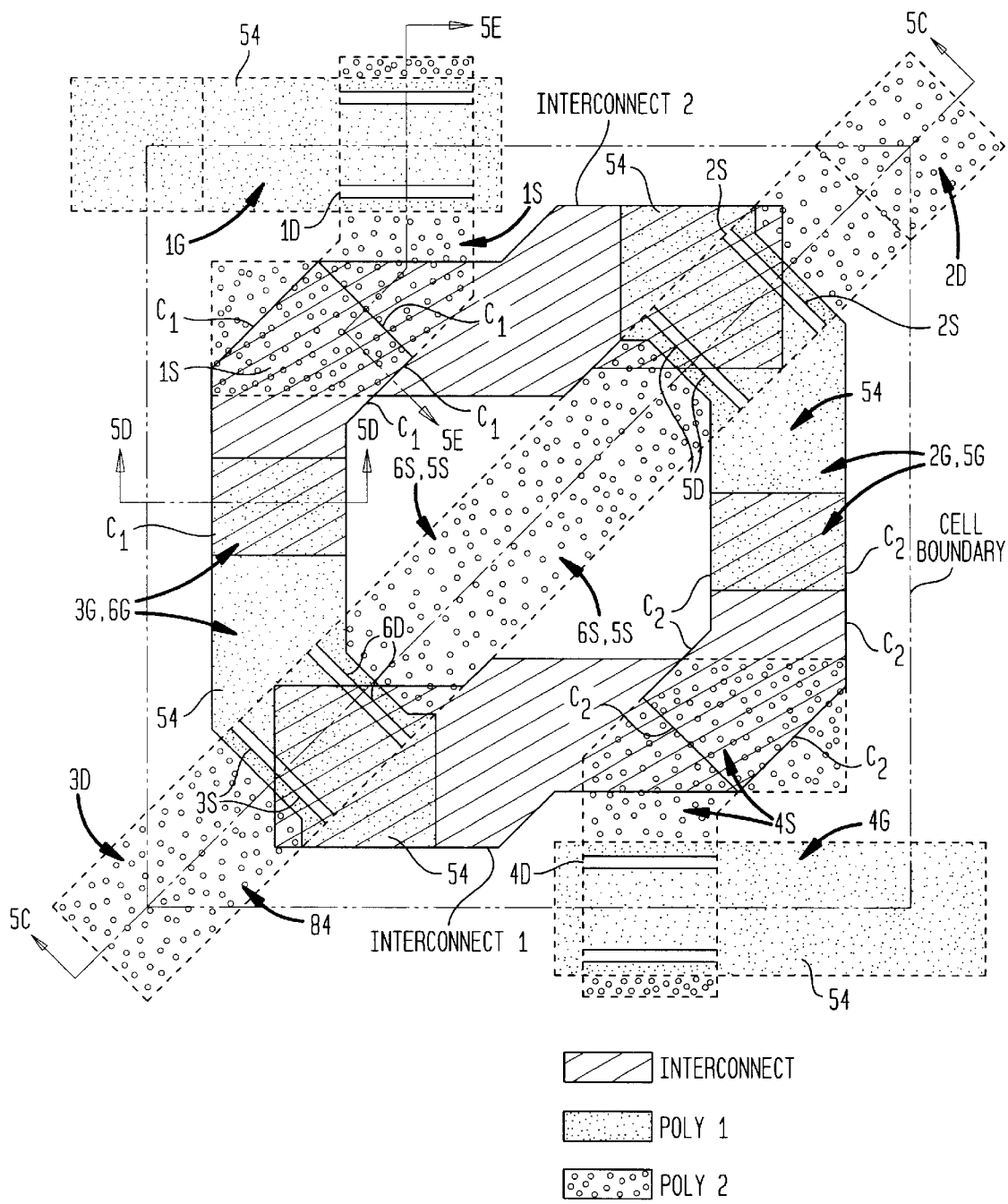
Figure 5C:
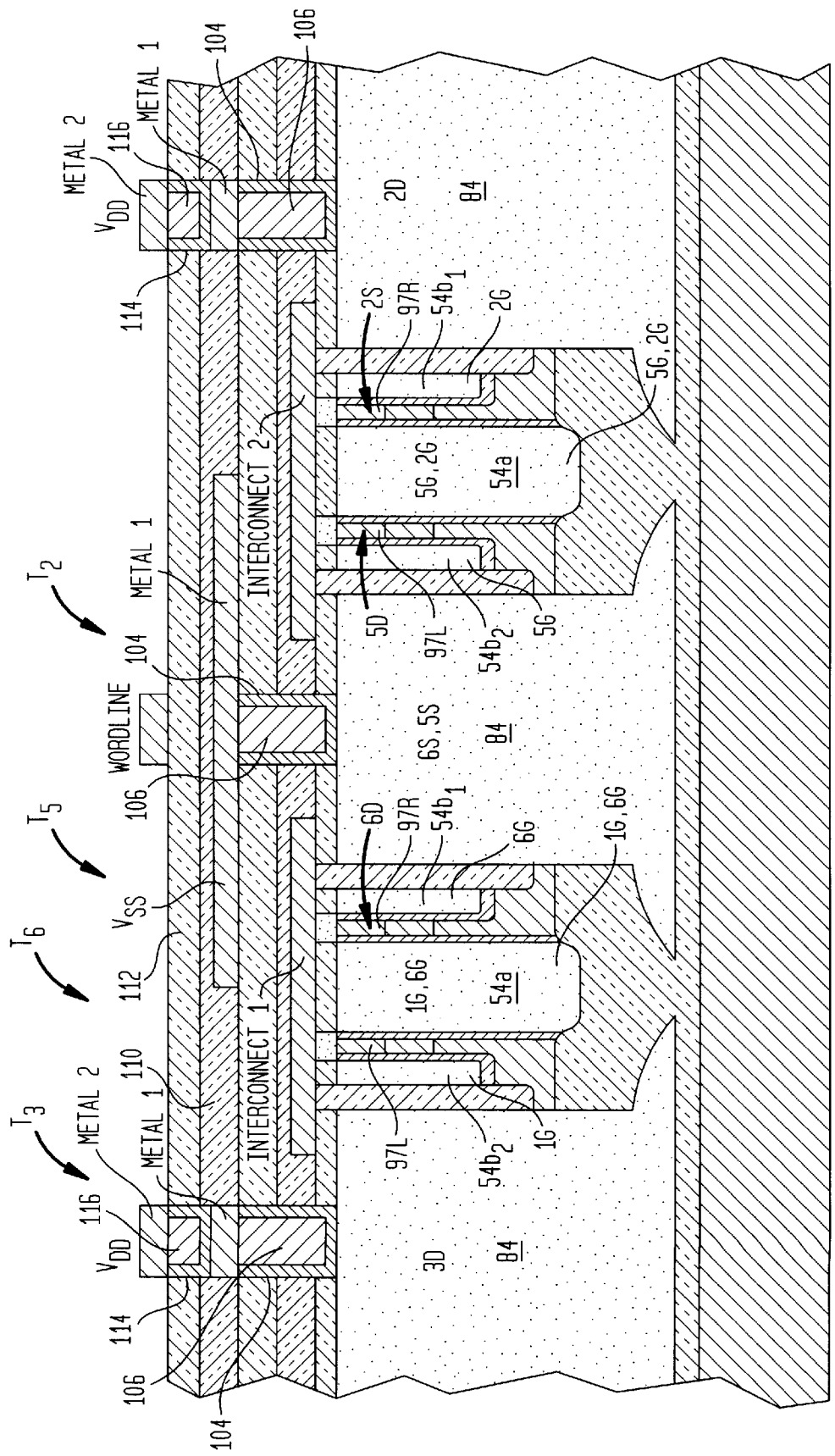
FIGS. 5C, 5D, and 5E are cross-section sketches of the SRAM cell of FIG. 4, the cross-sections being taken along lines 5C—5C, 5D—5D and 5E—5E in FIG. 5B.
Figure 5E:
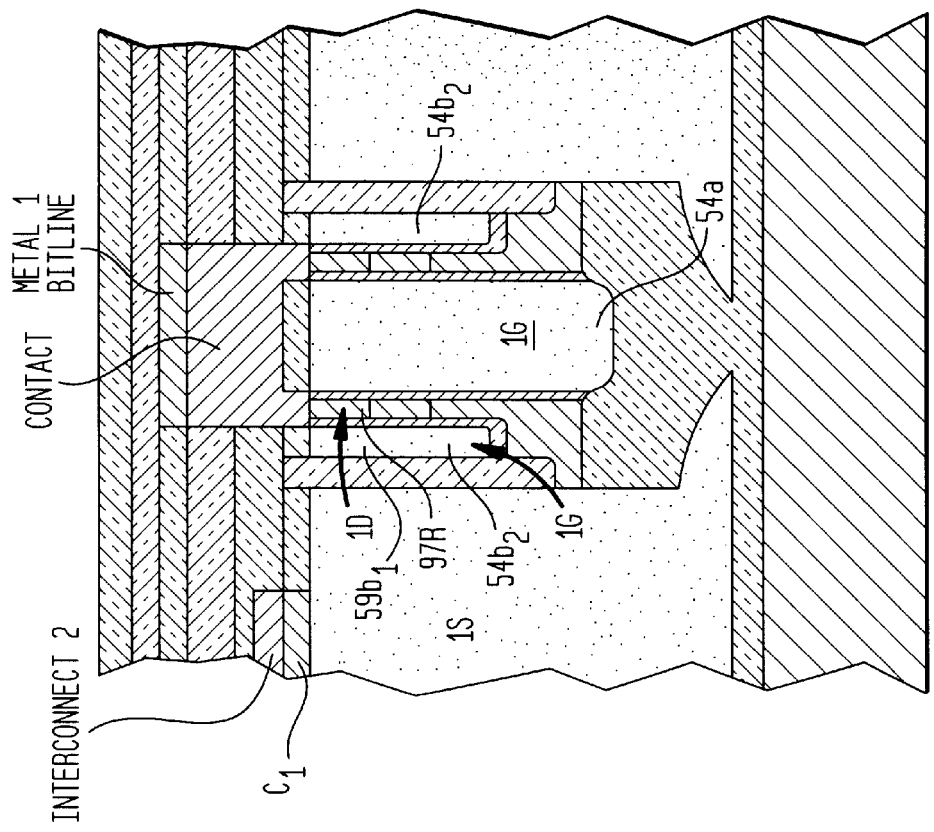
Figure 5D:
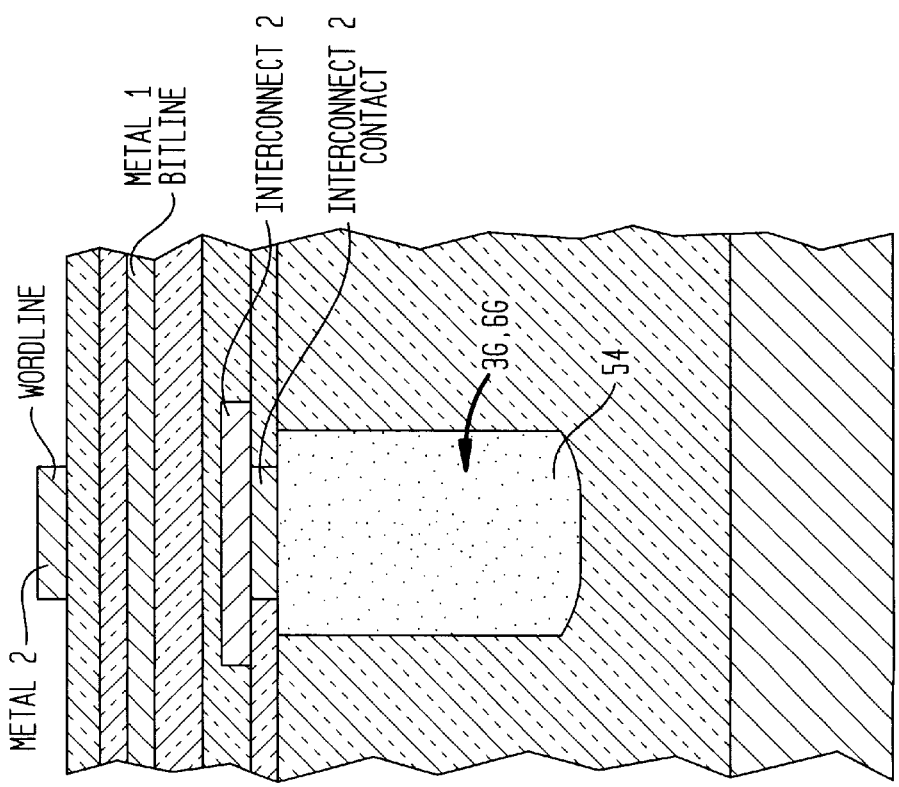
Figure 5F:
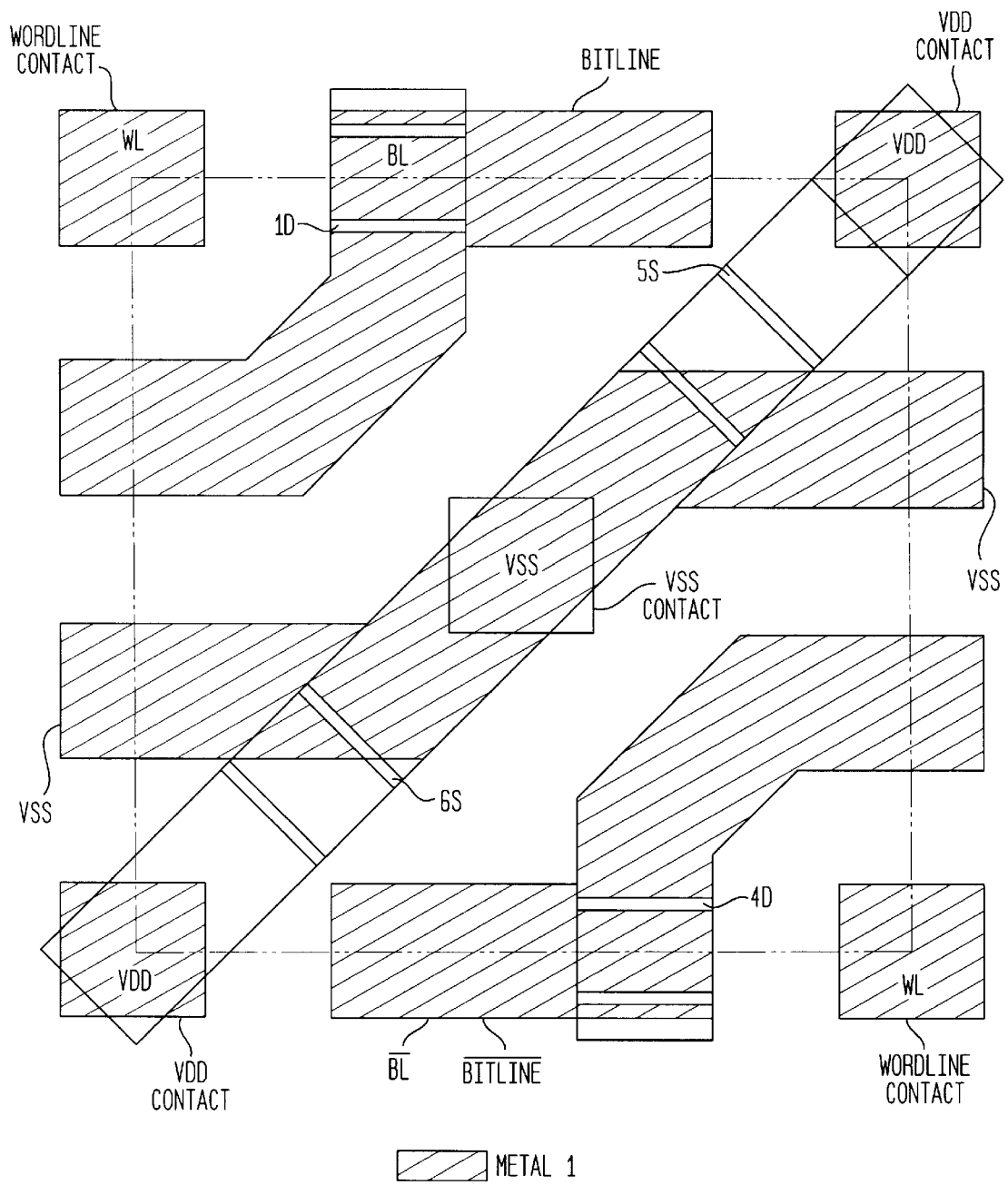

Referring now also to FIG. 5B, after forming the transistors $T_1$–$T_6$ in the manner described above in connection with FIGS. 2 et seq. in the layout shown in FIG. 5A. A contact $C_1$ is provided to make electrical connection to POLY 1 material in regions 54 (FIG. 5A) providing the 3G, 6G and to the POLY 2 material in region 84 (FIG. 5A) providing 1S. Simultaneously, a contact $C_2$ is provided to make electrical connection to POLY 1 material in regions 54 (FIG. 5A) providing the 2G, 5G and to the POLY 2 material in region 84 (FIG. 5A) providing 4S. Reference is also made to FIG. 5D which shows the cross-section across one of the contacts $C_1$, $C_2$, here across contact $C_1$ making electrical contact to POLY 1 region 54 providing 3G and 6G.

The contacts $C_1$ and $C_2$ are formed using lithography to provide an opening in the mask, not shown, for formation of a bottom silicide liner, not shown. After formation of the contact $C_1$, $C_2$ opening using any suitable etch form the dielectric under the mask, not shown, the mask is removed and a layer, not shown, of doped polycrystalline silicon, 10 to 100 micrometers thick, is deposited over the structure and through the opening in the dielectric. Next, a layer, not shown, of titanium, 5 to 30 micrometers thick, is deposited over the doped polycrystalline silicon. Chemical mechanical polishing (CMP) is used to remove the polycrystalline silicon/titanium except for the portions on the silicide. The polycrystalline silicon/titanium is annealed to produce TiSi2 contacts $C_1$ and $C_2$.

Next, two INTERCONNECTS, i.e., INTERCONNECT 1 and INTERCONNECT 2 are formed in the pattern shown in FIG. 4B which are in electrical contact with contact $C_1$ and $C_2$, respectively. As noted above in connection with FIG. 4, INTERCONNECT 1 electrically interconnects 3S, 4S, 6D, 2G and 5G while INTERCONNECT 2 electrically interconnects 3G, 6G, 2S, 5D, and 1S. The INTERCONNECTS 1 and 2 are formed using lithography to pattern a deposited layer of conductive material used to provide the INTERCONNECTS 1 and 2. Reference is also made to FIGS. 4C, 4D and 4E. It is first noted that the POLY 1 material used in transistors $T_3$ and $T_6$ are electrically connected. A cross-section through transistors $T_3$, $T_6$, $T_5$ and $T_2$ is shown in FIG. 4B.

After patterning INTERCONNECTS 1 and 2, a layer 100 (FIG. 5C) of silicon dioxide is deposited over the INTERCONNECTS 1 and 2. The layer 100 is planarized using CMP. A second layer 102 of silicon dioxide is deposited over the planarized layer 100. Using lithography, METAL 1 contacts are made by first forming a liner 104 of Ti/TiN and then providing a layer 106 of tungsten on the liner 104. Next, a conductive layer is deposited, lithographically patterned, annealed to form METAL 1.

Thus, the first metal, i.e., METAL 1, is formed in the pattern shown in FIG. 4F. As noted above in connection with FIG. 4, METAL 1 electrically interconnects: the BIT LINE (BL) to 1D; theBITLINE (BI) to 4D; and, $V_{ss}$ to both 5S and 6S. The METAL 1 is also used to provide WORD LINE and $V_{DD}$ contacts, WLCONTACT, VDDCONTACT, respectively, as shown. The WLCONTACTs are to the gate regions 1G and 4G, the VDDCONTACTs are to drain regions 2D and 3D, as described in connection with FIG. 4.

Figure 5G:
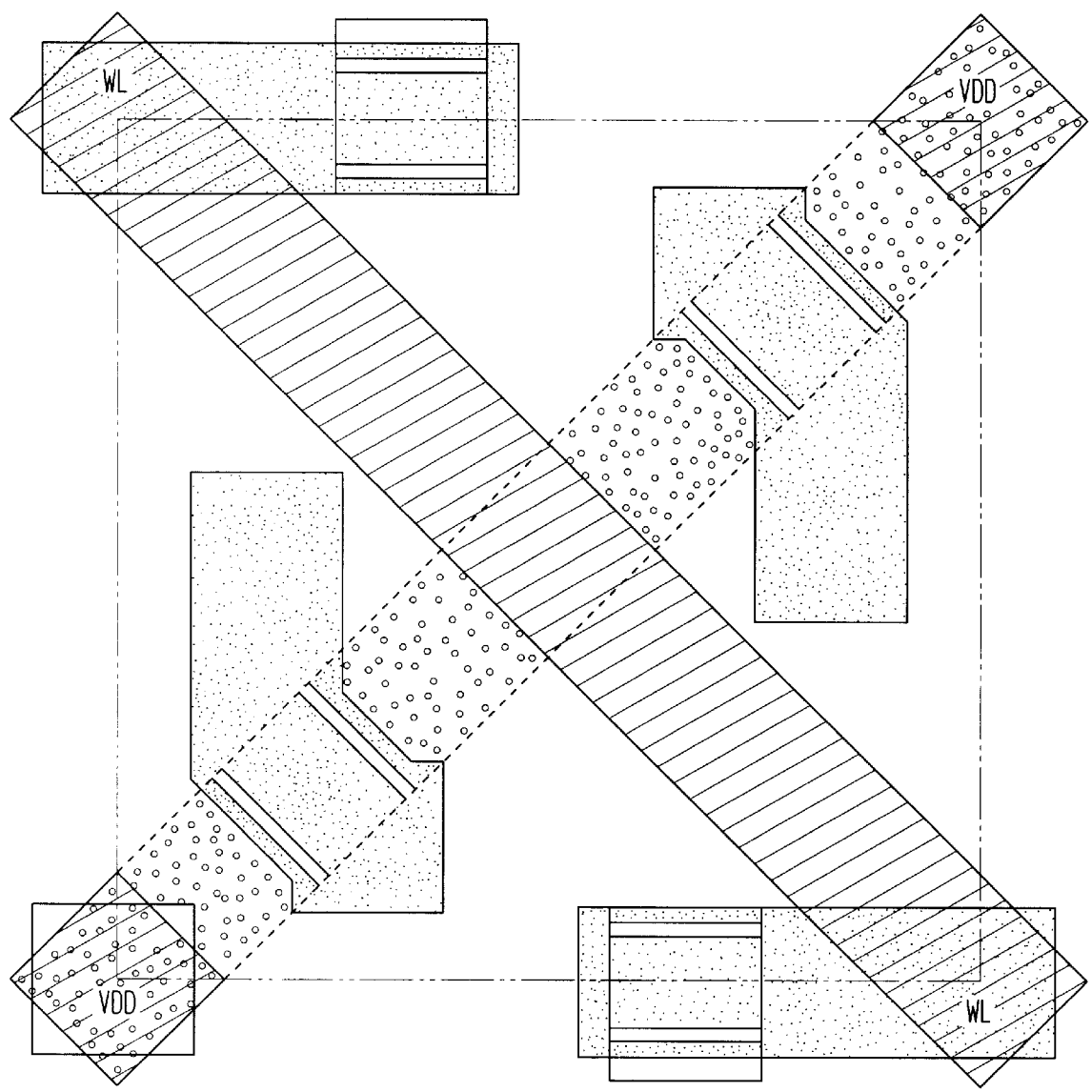

Next, the second metal, i.e., METAL 2, is formed in the pattern shown in FIG. 5G. More particularly, a layer 110 of silicon dioxide is deposited over METAL 1. The layer 110 is planarized using CMP. A layer 112 is deposited over the planarized surface of layer 110. Lithography is used to form vias in the layers 110, 112 where electrical contact is to be made to METAL 1, as required for the SRAM. As noted above in connection with FIG. 4, METAL 2 electrically interconnects: $V_{DD}$ to both 2D and 3D; and, WORDLINE (WL) to both 1G and 4G. After formation of the vias, and removal of masks, not shown, in the lithographic process, a layer 114 of Ti/TiN is deposited followed by a layer 116 of tungsten. CMP is used to planarize the layer 116 of tungsten. A conductive material to provide METAL 2 is deposited over the structure. The conductive material is lithographically patterned into METAL 2 to provide the connections shown in FIG. 5G.

Figure 6:
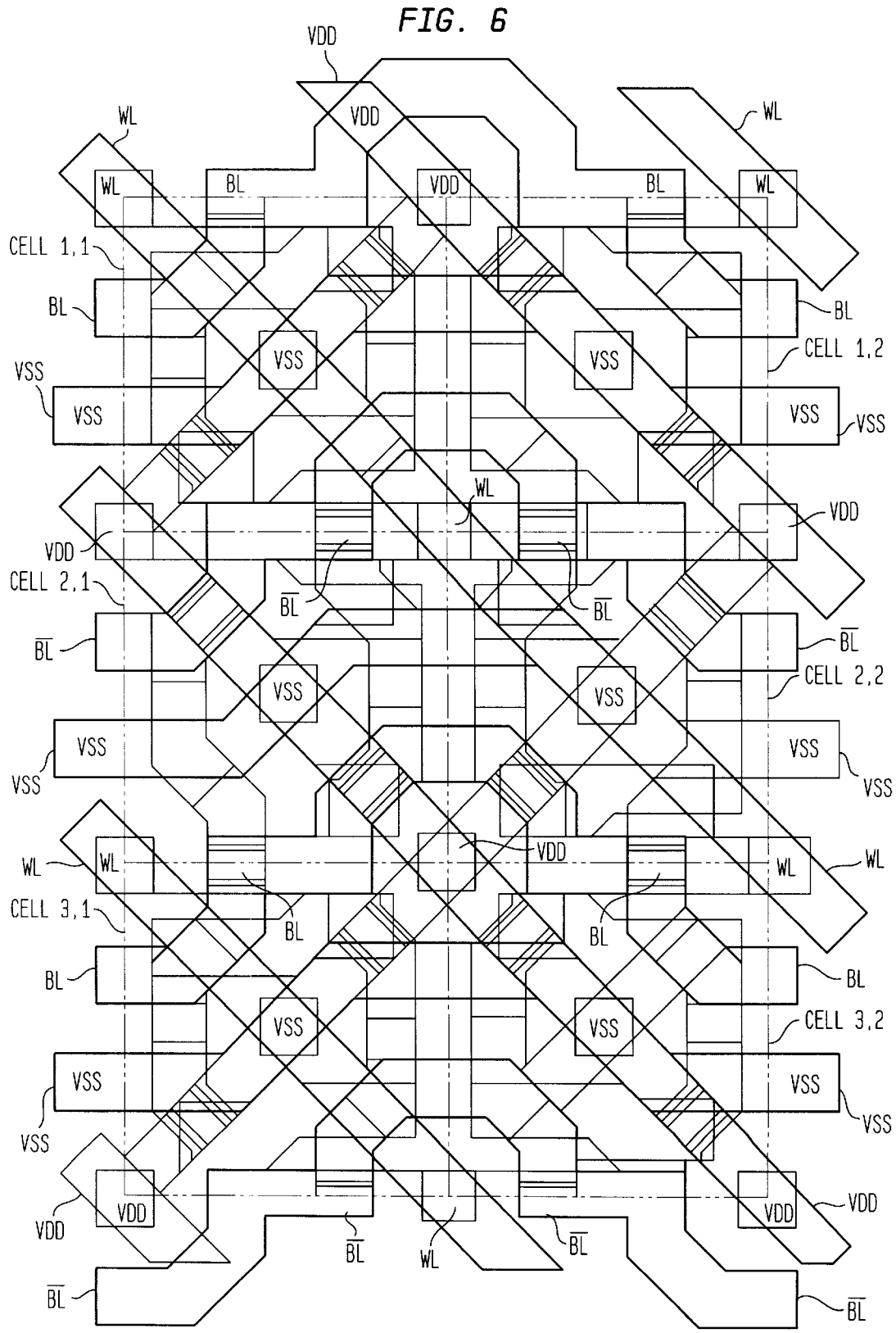
FIG. 6 is a plan view of a portion of an array of the cells of FIGS. 4 and 5A–5E.

Referring now to FIG. 6, a array of a plurality of the cell shown in FIG. 4, here an array of rows and columns of 6 cells, i.e., CELL 1,1, CELL 1,2, CELL 1,3, CELL 2,1, CELL 2,2 and CELL 3,1 is shown. Each one of the CELLS is identical in to the cell described above in connection with FIGS. 4 and 5A–5G.

Thus, it is noted that the SRAM array shown in FIG. 6 includes a plurality of SRAM cells arranged in rows and columns. Each one of the cells has a WORDLINE connected to a WORDINE CONTACT, such WORDLINE CONTACT being common to four contiguous one of the cells. Further, each one of the cells has a plurality of electrically interconnected MOS transistors $T_1$–$T_6$ arranged to provide the SRAM circuit shown in FIG. 4. Each one of the cells has a VDD CONTACT and a VSS CONTACT, one of such CONTACTs being disposed centrally within each one of the cells and the other one of the CONTACTs being common to four contiguous ones of the cells. Further, each one of the cells has the common one of the CONTACTs and the WORDLINE CONTACT disposed at peripheral, corner regions of the cell. Each one of the cells one of the VDD CONTACTs and VSS CONTACTs common to a pair of the transistors.

Other embodiments are within the spirit and scope of the appended claims.

What is claimed is:

1. An SRAM cell, comprising:
   a semiconductor body;
   a plurality of electrically interconnected pairs of double-gated CMOS transistors extending vertically within the semiconductor body.

2. An SRAM cell, comprising:
   a semiconductor body;
   a plurality of electrically interconnected pairs of double-gated CMOS transistors, each one of the transistors having source, drain and gate channels thereof extending vertically within the semiconductor body.

3. An SRAM array, comprising:
   a plurality of SRAM cells arranged in rows and columns, each one of the cells having a WORDLINE connected to a WORLDINE CONTACT, such WORDLINE CONTACT being common to four contiguous one of the cells.

4. An SRAM array, comprising:
   a plurality of SRAM cells arranged in rows and columns, each one of the cells having a plurality of electrically interconnected MOS transistors arranged to provide an SRAM circuit, each one of the cells having a VDD CONTACT and a VSS CONTACT, one of such CONTACTs being disposed centrally within each one of the cells and the other one of the CONTACTs being common to four contiguous ones of the cells.

5. The SRAM array recited in claim 4 wherein each one of the cells has a WORDLINE connected to a WORLDINE CONTACT, such WORDLINE CONTACT being common to four contiguous one of the cells.

6. The SRAM array recited in claim 5 wherein each one of the cells has the common one of the CONTACTs and the WORDLINE CONTACT disposed at peripheral, corner regions of the cell.

7. An SRAM cell comprising:
   a semiconductor body;
   a plurality of electrically interconnected pairs of CMOS transistors, each one of a pair of the transistors having:
   (a) a gate channel region disposed between a source region and a drain region, wherein such regions being horizontally separated by a common region extending vertically beneath a surface of the body;
   (b) a plurality dielectric layers, each one thereof being disposed on opposing surface portions of each one of the pair of gate channel regions;
   (c) a plurality of gate electrode conductive regions, a first one thereof being disposed on a corresponding one of the plurality of dielectric layers; and
   wherein one of the plurality of gate conductor regions is disposed in the common region and provides a common gate conductor region for the pair of transistors.

8. An SRAM cell, comprising:
a plurality of electrically interconnected pairs of MOS transistors disposed in a semiconductor body, each pair of transistors having:
   a gate channel region disposed between a source region and a drain region, such regions being horizontally separated by a common region extending vertically beneath a surface of the body;
   a plurality dielectric layers, each one thereof being disposed on opposing surface portions of each one of the pair of gate channel regions;
   a plurality of gate electrode conductive regions, a first one thereof being disposed on a corresponding one of the plurality of dielectric layers;
   an insulating layer extending horizontally beneath the surface of the semiconductor body such insulating layer being disposed beneath the pair of transistors.

9. The SRAM cell recited in claim 8 wherein one of the plurality of gate conductor regions is disposed in the common region and provides a common gate conductor region for the pair of transistors.

10. The SRAM cell recited in claim 8 wherein the pair of transistors are CMOS transistors.

11. The SRAM cell recited in claim 9 wherein the pair of transistors are CMOS transistors.

12. A semiconductor structure comprising:
a semiconductor body;
a pair of CMOS transistors, such pair of transistors having a common gate region extending vertically into the semiconductor body;
wherein each one of the transistors comprises:
   a gate channel region extending vertically into the semiconductor body between a source region and a drain region, such regions being adjacent the common gate region; and
   a second gate region;
   wherein the gate channel region of a first one of the pair of transistor is disposed between the common gate region and the second gate region of the first one of the pair of transistors; and
   wherein the gate channel region of a second one of the pair of transistor is disposed between the common gate region and the second gate region of the second one of the pair of transistors.

13. The semiconductor structure recited in claim 12 including an electrical conductor and
   wherein the electrical conductor electrically interconnects the common gate region, the first gate region and second gate region.

14. The semiconductor structure recited in claim 12, wherein the gate channel region of the first one of the pair of transistors is disposed adjacent one side of the common gate region.

15. The semiconductor structure recited in claim 12, wherein the gate channel region of the second one of the pair of transistors is disposed adjacent an opposite side of the common gate region.

* * * * *